US012622054B2

(12) United States Patent
Hall et al.

(10) Patent No.: US 12,622,054 B2
(45) Date of Patent: May 5, 2026

(54) INTEGRATION OF MULTIMODAL TRANSISTORS WITH TRANSISTOR FABRICATION SEQUENCE

(71) Applicant: NXP USA, Inc., Austin, TX (US)

(72) Inventors: Mark Douglas Hall, Austin, TX (US); Tushar Praful Merchant, Austin, TX (US); Maryfe Hernandez, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 438 days.

(21) Appl. No.: 18/244,423

(22) Filed: Sep. 11, 2023

(65) Prior Publication Data

US 2025/0089359 A1 Mar. 13, 2025

(51) Int. Cl.
H10D 86/01 (2026.01)
H10D 86/00 (2025.01)

(52) U.S. Cl.
CPC ........... H10D 86/01 (2025.01); H10D 86/201 (2025.01)

(58) Field of Classification Search
CPC ........... H10D 84/8311; H10D 84/8312; H10D 30/501
See application file for complete search history.

(56) References Cited

U.S. PATENT DOCUMENTS

2016/0056301 A1 2/2016 Lee
2018/0083113 A1 3/2018 Balakrishnan et al.

2022/0029027 A1* 1/2022 Sporea ................. H10K 10/482
2022/0359749 A1 11/2022 Lee et al.
2023/0093897 A1 3/2023 Kim et al.

FOREIGN PATENT DOCUMENTS

KR 20140038295 A 3/2014

OTHER PUBLICATIONS

A.K. Kapoor, Electrostatics of JFET at 6nm Channel Length: A Simulation Study, Electronics Letters 47(15):870-871, Abstract, Jul. 21, 2011.
Isin Pesch et al., Researchers Demonstrate Multimodal Transistor in Artificial Neural Networks, TechXplore, Jan. 17, 2022, 4 pages.

(Continued)

*Primary Examiner* — Nelson Garces

(57) ABSTRACT

A semiconductor device and fabrication method are described for integrating a nanosheet transistor with a multimodal transistor (MMT) in a single nanosheet process flow by processing a wafer substrate to form buried metal source/drain structures in an MMT region that are laterally spaced apart from one another and positioned below an MMT semiconductor channel layer before forming a transistor stack of alternating Si and SiGe layers in an FET region which are selectively processed to form gate electrode openings so that a first ALD oxide and metal layer are patterned and etched to form gate electrodes in the transistor stack and to form a channel control gate electrode over the MMT semiconductor channel layer, and so that a second oxide and conductive layer are patterned and etched to form a current control gate electrode over the MMT semiconductor channel layer and adjacent to the channel control gate electrode.

20 Claims, 9 Drawing Sheets

(56)                References Cited

OTHER PUBLICATIONS

Radu Sporea, A New Device with Unique Functionality Could Signal a New Design Philosophy for Electronics, Advanced Science News, Nov. 3, 2020, 6 pages.

Jake Hertz, A New Multimodal Architecture Said to Redefine the Way Transistors Work, www.allaboutcircuits.com, Nov. 2, 2020.

Anshal Gupta et al., Buried Power Rail Integration With FinFETs for Ultimate CMOS Scaling, IEEE Transactions on Electron Devices, vol. 67, No. 12, Dec. 2020, 6 pages.

Emilie Bernard et al., First Internal Spacers' Introduction in Record High ION/IOFF TiN/HfO2 Gate Multichannel MOSFET Satisfying Both High-Performance and Low Standby Power Requirements, IEEE Electron Device Letters, vol. 30, No. 2, Feb. 2009, 4 pages.

S. B. Samavedam et al., Future Logic Scaling: Towards Atomic Channels and Deconstructed Chips, 2020 IEEE International Electron Devices Meeting (IEDM), San Francisco, CA, Dec. 2020.

Imec, Imec Demonstrates Backside Power Delivery with Buried Power Rails for Back- and Frontside Routing, Press Release, Jun. 14, 2022.

Justin B. Jackson et al., Junction Field Effect Transistors for Nanoelectronics, IEEE Transactions on Nanotechnology, vol. 8, No. 7, Nov. 2009, 9 pages.

Isin Surekcigil Pesch et al., Multimodal Transistors as ReLU Activation Functions in Physical Neural Network Classifiers, www.

nature.com, Scientific Reports, 12:670, published online Jan. 13, 2022.

Isin Surekcigil Pesch et al., Multimodal Transistor Successfully Demonstrated in Artificial Neural Networks, www.technologynetworks.com, Jan. 19, 2022.

Novel Multimodal Transistor | New transistor architecture . . . , www.leadingedgeonly.com, downloaded from the Internet Jul. 5, 2023.

Eva Bestelink et al., Suppression of Hot-Carrier Effects Facilitate by the Multimodal Thin-Film Transistor Architecture, Advanced Electronic Materials, published online Aug. 16, 2021.

Radu Sporea, The Multimodal Transistor—Video Abstract, YouTube, Jul. 5, 2023.

Peide D. Ye et al., The Nanosheet Transistor is the Next (and Maybe Last) Step in Moore's Law, IEEE Spectrum, Jul. 30, 2019.

Eva Bestelink et al., Versatile Thin-Film Transistor with Independent Control of Charge Injection and Transport for Mixed Signal and Analog Computation, Advanced Intelligent Systems, Sep. 2020, 9 pages.

Bestelink, E., "Oxide transistors: 1-14 unconventional architectures and their applications", Proceedings of the SPIE, SPIE, US, vol. 11687, Mar. 5, 2021.

Sporea, R.A., "Design considerations for the source region of Schottky-barrier source-gated transistors", 2017 International Semiconductor Conference (CAS), Oct. 11-14, 2017.

* cited by examiner

NANOSHEET REGION 1          MMT REGION 2

Si 11

BOX 10

Photo Etch 12

Si 11A          12A          Si 11B          12B          11C

BOX 10

W 15
TiN 14
Ox/Nit 13

Si 11A          Si 11B          11C

BOX 10

Si 11A          W 15A          Si 11B          W 15B          11C

Ox/Nit 13A          Ox/Nit 13B
TiN 14A          TiN 14B
BOX 10

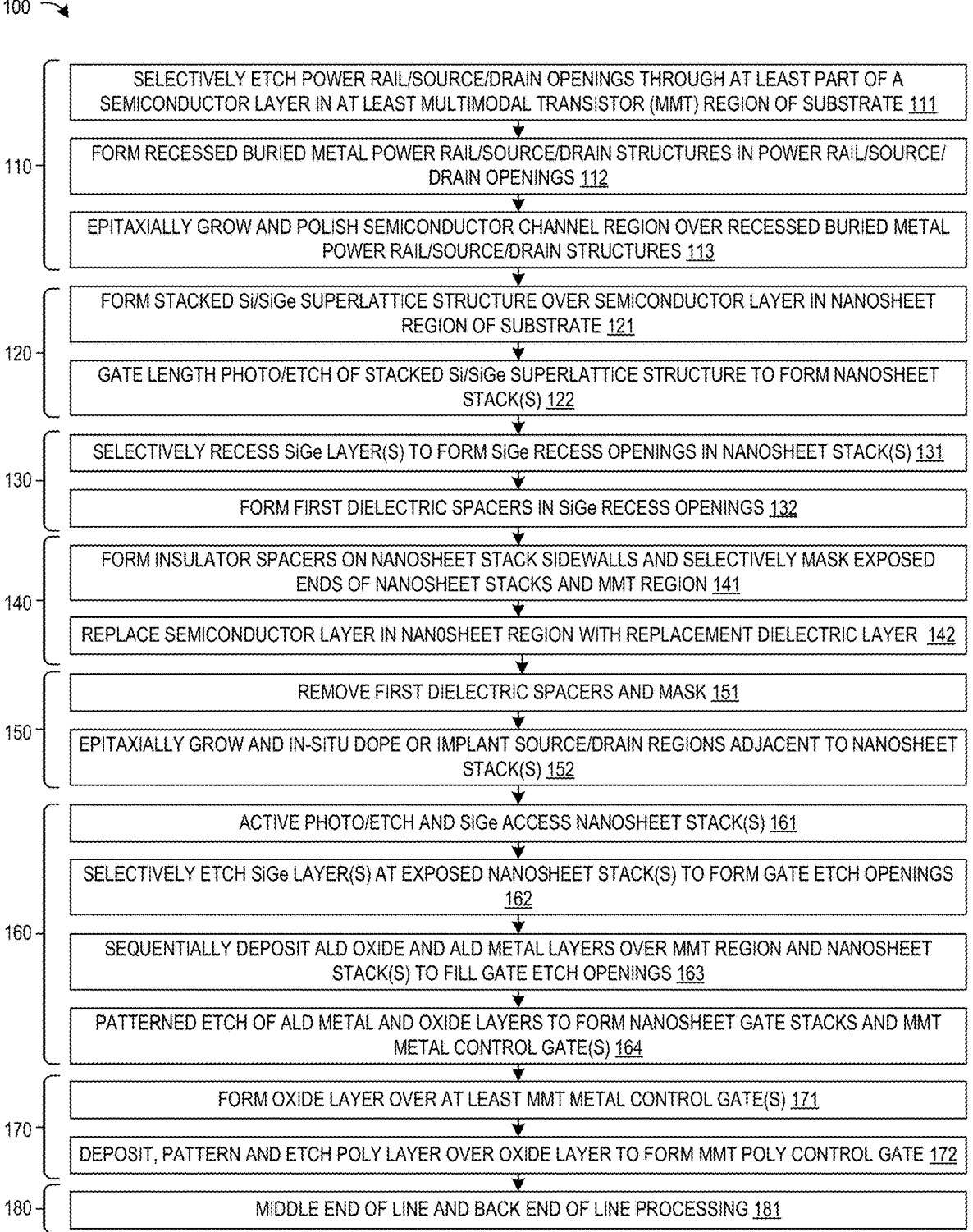

100

SELECTIVELY ETCH POWER RAIL/SOURCE/DRAIN OPENINGS THROUGH AT LEAST PART OF A
SEMICONDUCTOR LAYER IN AT LEAST MULTIMODAL TRANSISTOR (MMT) REGION OF SUBSTRATE 111

110

FORM RECESSED BURIED METAL POWER RAIL/SOURCE/DRAIN STRUCTURES IN POWER RAIL/SOURCE/
DRAIN OPENINGS 112

EPITAXIALLY GROW AND POLISH SEMICONDUCTOR CHANNEL REGION OVER RECESSED BURIED METAL
POWER RAIL/SOURCE/DRAIN STRUCTURES 113

120

FORM STACKED Si/SiGe SUPERLATTICE STRUCTURE OVER SEMICONDUCTOR LAYER IN NANOSHEET
REGION OF SUBSTRATE 121

GATE LENGTH PHOTO/ETCH OF STACKED Si/SiGe SUPERLATTICE STRUCTURE TO FORM NANOSHEET
STACK(S) 122

130

SELECTIVELY RECESS SiGe LAYER(S) TO FORM SiGe RECESS OPENINGS IN NANOSHEET STACK(S) 131

FORM FIRST DIELECTRIC SPACERS IN SiGe RECESS OPENINGS 132

140

FORM INSULATOR SPACERS ON NANOSHEET STACK SIDEWALLS AND SELECTIVELY MASK EXPOSED
ENDS OF NANOSHEET STACKS AND MMT REGION 141

REPLACE SEMICONDUCTOR LAYER IN NANOSHEET REGION WITH REPLACEMENT DIELECTRIC LAYER 142

150

REMOVE FIRST DIELECTRIC SPACERS AND MASK 151

EPITAXIALLY GROW AND IN-SITU DOPE OR IMPLANT SOURCE/DRAIN REGIONS ADJACENT TO NANOSHEET
STACK(S) 152

160

ACTIVE PHOTO/ETCH AND SiGe ACCESS NANOSHEET STACK(S) 161

SELECTIVELY ETCH SiGe LAYER(S) AT EXPOSED NANOSHEET STACK(S) TO FORM GATE ETCH OPENINGS
162

SEQUENTIALLY DEPOSIT ALD OXIDE AND ALD METAL LAYERS OVER MMT REGION AND NANOSHEET
STACK(S) TO FILL GATE ETCH OPENINGS 163

PATTERNED ETCH OF ALD METAL AND OXIDE LAYERS TO FORM NANOSHEET GATE STACKS AND MMT
METAL CONTROL GATE(S) 164

170

FORM OXIDE LAYER OVER AT LEAST MMT METAL CONTROL GATE(S) 171

DEPOSIT, PATTERN AND ETCH POLY LAYER OVER OXIDE LAYER TO FORM MMT POLY CONTROL GATE 172

180

MIDDLE END OF LINE AND BACK END OF LINE PROCESSING 181

Figure 19

INTEGRATION OF MULTIMODAL TRANSISTORS WITH TRANSISTOR FABRICATION SEQUENCE

BACKGROUND OF THE INVENTION

Field of the Invention

The present disclosure is directed in general to the field of semiconductor devices. In one aspect, the present disclosure relates to integrated multimodal transistor devices with field effect transistor (FET) devices and methods of fabricating same.

Description of the Related Art

As semiconductor device sizes are scaled down, the requirements for device design and fabrication continue to be tightened in order to fit more circuitry on smaller chips. As device sizes shrink, increasingly complex process integrations are used to define semiconductor device features and structures. For example, finFET transistors replaced planar FET transistors as the leading edge transistor architecture for 1 Xnm nodes, but with next-generation technologies, stacked nanosheet transistors are in line to replace finFETs as the leading edge transistor architecture starting at the 3 nm node, followed by forksheet devices at the 2 nm node, stacked complementary nanosheet FETs, and so on. However, the existing and projected FET devices employ thin film transistor (TFT) designs having a single gate electrode in the channel region to control both charge injection and switching functions of the device, resulting in the drain current having a quadratic response to the applied gate electrode voltage. Unfortunately, the transfer characteristics for conventional TFT designs are not well suited for computational approaches increasingly required by artificial intelligence applications, such as artificial neural networks which require rectified linear unit (ReLU) activation functions having a linear dependence between the input device voltage and output (drain) current. While multimodal transistor (MMT) devices have recently been proposed as TFT devices which have a linear drain current response to the gate voltage(s), existing MMTs have been demonstrated on silicon using large dimensions and high operating voltages. Thus, existing semiconductor processes for fabricating leading edge FET transistors have not been integrated with the MMT device fabrication processes by virtue of the challenges with fabricating leading edge FET devices with additional MMT device circuit elements while meeting the performance requirements and cost constraints. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings.

FIG. 19 illustrates a simplified process flow for integrating the fabrication of nanosheet transistor devices and MMT devices in accordance with selected embodiments of the present disclosure.

DETAILED DESCRIPTION

Figures 1, 2, 3, 4:
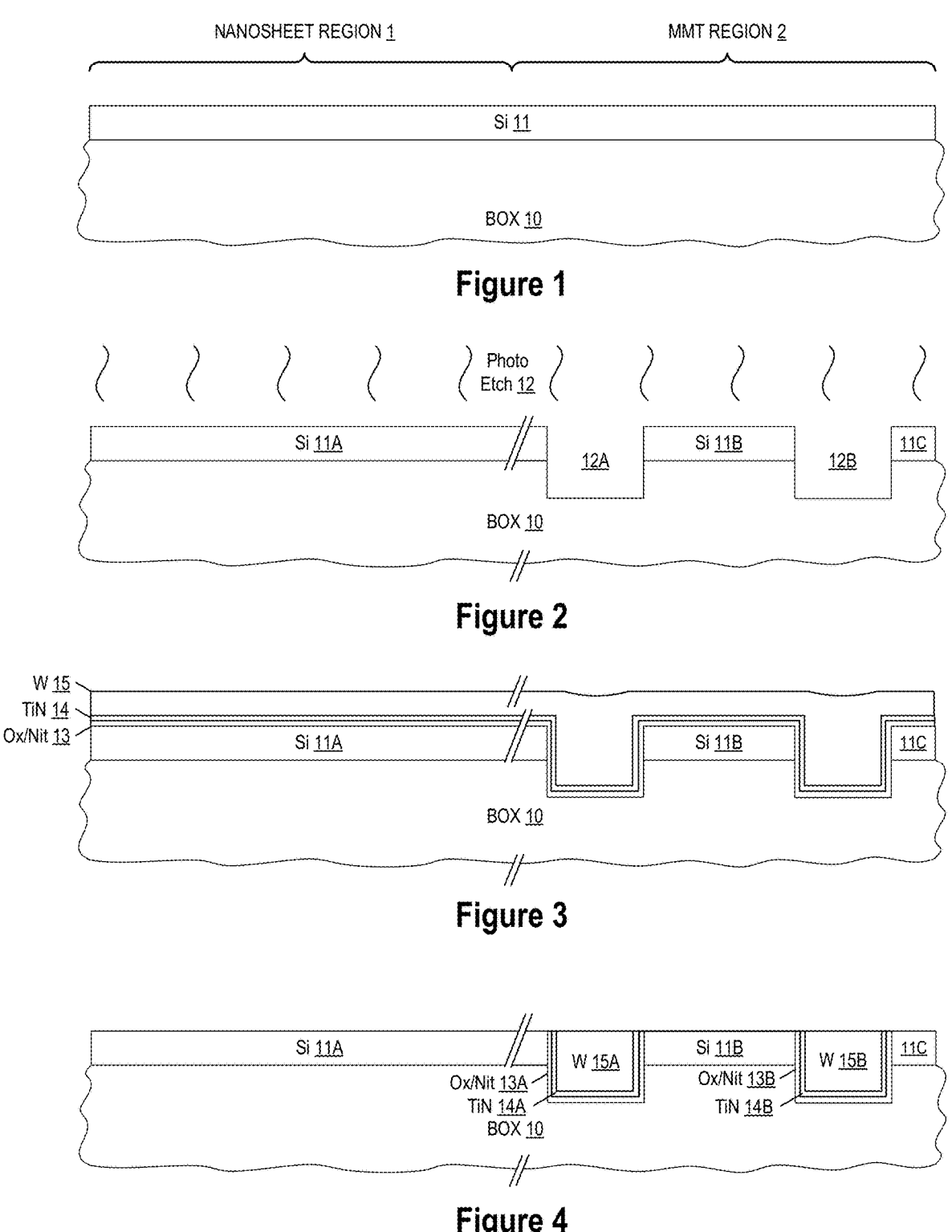
FIG. 1 is a partial cross-sectional view of a semiconductor structure having a nanosheet region and multimodal transistor (MMT) region including a semiconductor layer disposed over a buried oxide substrate in accordance with selected embodiments of the present disclosure.
FIG. 2 illustrates processing subsequent to FIG. 1 after etching buried source/drain openings in the MMT region that extend through the semiconductor layer and into the buried oxide substrate in accordance with selected embodiments of the present disclosure.
FIG. 3 illustrates processing subsequent to FIG. 2 after forming one or more metal source/drain layers in the etching buried source/drain openings in accordance with selected embodiments of the present disclosure.
FIG. 4 illustrates processing subsequent to FIG. 3 after planarizing the one or more metal source/drain layers with the semiconductor layer in accordance with selected embodiments of the present disclosure.

A semiconductor device and fabrication method are described for integrating the fabrication of multimodal (MMT) devices with thin film FET devices in a single fabrication process flow, thereby providing a straightforward method for integrating MMT devices with advanced thin film FET devices on the same die with additional MMT device processing steps that are designed to have minimal effect on the thin film FET devices. As used herein, a MMT device is a transistor with metal source/drain regions buried under a semiconductor channel region and with separate or split gate electrodes to separate charge injection from conduction so that a current control gate electrode determines the amount of charge to be transferred to the drain, and a channel control (independent on/off) gate electrode determines when that charge will be transferred to the drain. There is a linear relationship between input voltage and output current. While specific implementation details are described herein with reference to one or more example embodiments, the present disclosure is directed to fabricating MMT devices while the thin film FET devices are being fabricated to make dual use of many process steps. The steps used for fabricating the MMT devices are standard process steps used for fabricating the thin film FET devices, so no new fab tools may be needed. For example, a nanosheet transistor semiconductor fabrication process flow may be used to integrate the fabrication of MMT devices. In selected embodiments, an initial set of fabrication steps may be used to form a semiconductor substrate structure with buried metal source/drain structures that are covered by a semiconductor channel layer in a defined MMT region of the semiconductor substrate structure. The initial set of fabrication steps may be performed using existing processing steps to fabricate buried power rail structures in the semiconductor substrate structure that may be modified in accordance with the present disclosure. For example, a buried power rail photo and etch sequence may be modified to selectively etch source/drain openings through a semiconductor layer and into an underlying buried oxide region in the MMT region, followed by forming recessed tungsten source/drain structures in the source/drain openings that are covered by an epitaxial semiconductor channel layer formed on the semiconductor substrate structure. Subsequently, the nanosheet region is processed by patterning and etching an initial Si/SiGe superlattice substrate structure to form separate nanosheet transistor stacks having ALD metal gate electrodes in the transistor stacks. In selected embodiments, the processing steps used to fabricate the ALD metal gate electrodes are used to simultaneously form a first MMT metal control gate for each MMT device. Subsequently, the MMT region is processed to selectively form a second MMT metal control gate for each MMT device. For example, an insulating layer and conductive polysilicon layer may be sequentially formed over the nanosheet and MMT regions, followed by patterning and etching the conductive polysilicon layer to form the second MMT metal control gate.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. In addition, the dimensions of some of the elements in the figures may be exaggerated relative to other elements to help improve the understanding of the embodiments of the present disclosure. For example, the actual lateral dimension or measure of the nanosheet transistor devices will be much smaller than the actual lateral dimension or measure of the MMT device. Further, reference numerals have been repeated among the drawings to represent corresponding or analogous elements. In addition, the depicted device layers that are shown as being deposited and/or etched are represented with simplified line drawings, though it will be appreciated that, in reality, the actual contours or dimensions of device layers will be non-linear, such as when the described etch processes are applied at different rates to different materials, or when the described deposition or growth processes generate layers based on the underlaying materials.

Various illustrative embodiments of the present invention will now be described in detail with reference to FIGS. 1-20. It is noted that, throughout this detailed description, certain layers of materials will be deposited and removed to form the semiconductor structure. Where the specific procedures for processing such layers or thicknesses of such layers are not detailed below, conventional techniques known to one skilled in the art for depositing, removing or otherwise forming such layers at appropriate thicknesses shall be intended. Such details are well known and not considered necessary to teach one skilled in the art how to make or use the present invention.

One of the limitations with nanosheet transistors and other conventional thin film FET devices is that the drain current has a quadratic response to the input gate voltage. This performance limitation has been addressed with MMT device designs which use a pair of separately controlled gate electrodes to provide drain current having a linear response. To achieve this, MMT devices use a first control gate electrode to set the drain current and use a second control gate electrode to open or close the conductive channel between the source and drain. However, existing semiconductor processes for fabricating nanosheet transistors have not been used to fabricate MMT devices because they are not well suited at a practical level for integrating MMT devices which typically require metal source/drain regions and which have been implemented with silicon using large dimensions and high operating voltages. In addition, the use of separate die for the nanosheet transistors and MMT devices can increase the overall size of the final circuit solution, and require additional wiring and connection costs.

Turning now to FIG. 1, a partial cross-sectional view illustrates a semiconductor structure including a semiconductor layer 11 which is formed over a buried oxide (BOX) or dielectric substrate 10 in accordance with selected embodiments of the present disclosure. As depicted, the semiconductor structure 10-11 has a nanosheet region 1 and multimodal transistor (MMT) region 2 where different devices will be formed as described more fully here-in-below. Though not shown, it will be appreciated that the semiconductor structure 10-11 is formed over an underlying substrate which may be implemented as a bulk silicon substrate, monocrystalline silicon (doped or undoped), or any semiconductor material including, for example, Si, SiC, SiGe, SiGeC, Ge, GaAs, InAs, InP as well as other Group III-V compound semiconductors or any combination thereof, and may be formed as the bulk handling wafer. As will be appreciated, any suitable sequence of processing steps may be used to form the semiconductor structure 10-11, such as by bonding or implantation of oxygen.

The terms "epitaxial growth, "epitaxial deposition" and "epitaxial formation" all refer generally to a semiconductor process for growing a semiconductor material or layer having a (substantially) crystalline structure on a deposition surface of seed semiconductor material or layer having a (substantially) crystalline structure such that the semiconductor material/layer being grown has substantially the same crystalline characteristics as the seed semiconductor material/layer. In an epitaxial deposition process, the chemical reactants provided by the source gases are controlled, and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed.

FIG. 2 illustrates processing of the semiconductor structure subsequent to FIG. 1 after using a photo etch process 12 to etch buried source/drain openings 12A, 12B in the MMT region 2 that extend through the semiconductor layer 11 and into the buried oxide substrate layer 10 in accordance with selected embodiments of the present disclosure. While any suitable photo etch process 12 may be used, a first patterned mask (not shown) may be formed over the semiconductor structure 10-11 by depositing, patterning, etching or developing a photoresist or hard mask layer on the semiconductor layer 11. With the patterned photoresist mask in place, one or more etch processes are applied to create the buried source/drain openings 12A, 12B in the MMT region 2. The etch processing can include using the patterned photoresist mask to perform a sequence of reactive-ion etching (RIE) steps having suitable etch chemistry properties to remove, in sequence, the exposed portions of the semiconductor layer 11 and the underlying buried oxide substrate layer 10. For example, a controlled photo etch process 12, such as a timed anisotropic dry etch, may be used to remove a portion of the exposed portions of the semiconductor layer 11 and the underlying buried oxide substrate layer 10 to a predetermined depth. As depicted, the etching of the semiconductor (Si) layer 11 in the MMT region leaves unetched semiconductor layers 11A-C, including the remnant semiconductor (Si) layer 11B which corresponds to the semiconductor channel layer of the finally-formed MMT device. And while the sidewalls of the buried source/drain openings 12A, 12B are substantially vertical, it will be appreciated minor deviations in the sidewall profile may occur at each layer due to etch processing variations.

FIG. 3 illustrates processing of the semiconductor structure subsequent to FIG. 2 after forming one or more metal source/drain layers 13-15 in the etching buried source/drain openings 12A, 12B in accordance with selected embodiments of the present disclosure. In selected embodiments, the metal source/drain layers 13-15 are formed by first conformally depositing a first insulating liner layer 13 (e.g., oxide or nitride) over the semiconductor structure to coat the bottom and sidewalls of the buried source/drain openings 12A, 12B. Subsequently, a second conformal barrier liner layer 14 (e.g., TiN) may be conformally deposited on the first insulating liner layer 13 to coat the bottom and sidewalls of the buried source/drain openings 12A, 12B. Finally, one or more conductive layers 15 (e.g., tungsten) are formed or deposited over the semiconductor structure to completely fill the buried source/drain openings 12A, 12B. In selected embodiments, the conductive layer(s) 15 may be formed using any suitable deposition process, such as by depositing one or more conductive layers using CVD, PECVD, PVD, ALD, sputtering, or any combination(s) of the above to fill the buried source/drain openings 12A, 12B.

FIG. 4 illustrates processing of the semiconductor structure subsequent to FIG. 3 after planarizing the one or more metal source/drain layers 13-15 with the semiconductor layer 11A-C in accordance with selected embodiments of the present disclosure. While any suitable planarization process may be used, in selected embodiments, a chemical mechanical polish (CMP) process may be applied to remove portions of the metal source/drain layers 13-15 formed on top of the semiconductor layer 11A-C, where the CMP process is controlled to stop at the semiconductor layer 11A-C. As a result of the planarizing step, the top of the semiconductor layer is cleared, and the remaining portions of the metal source/drain layers 13A-15A, 13B-15B fill the buried source/drain openings 12A, 12B.

Figures 5, 6, 7, 8:
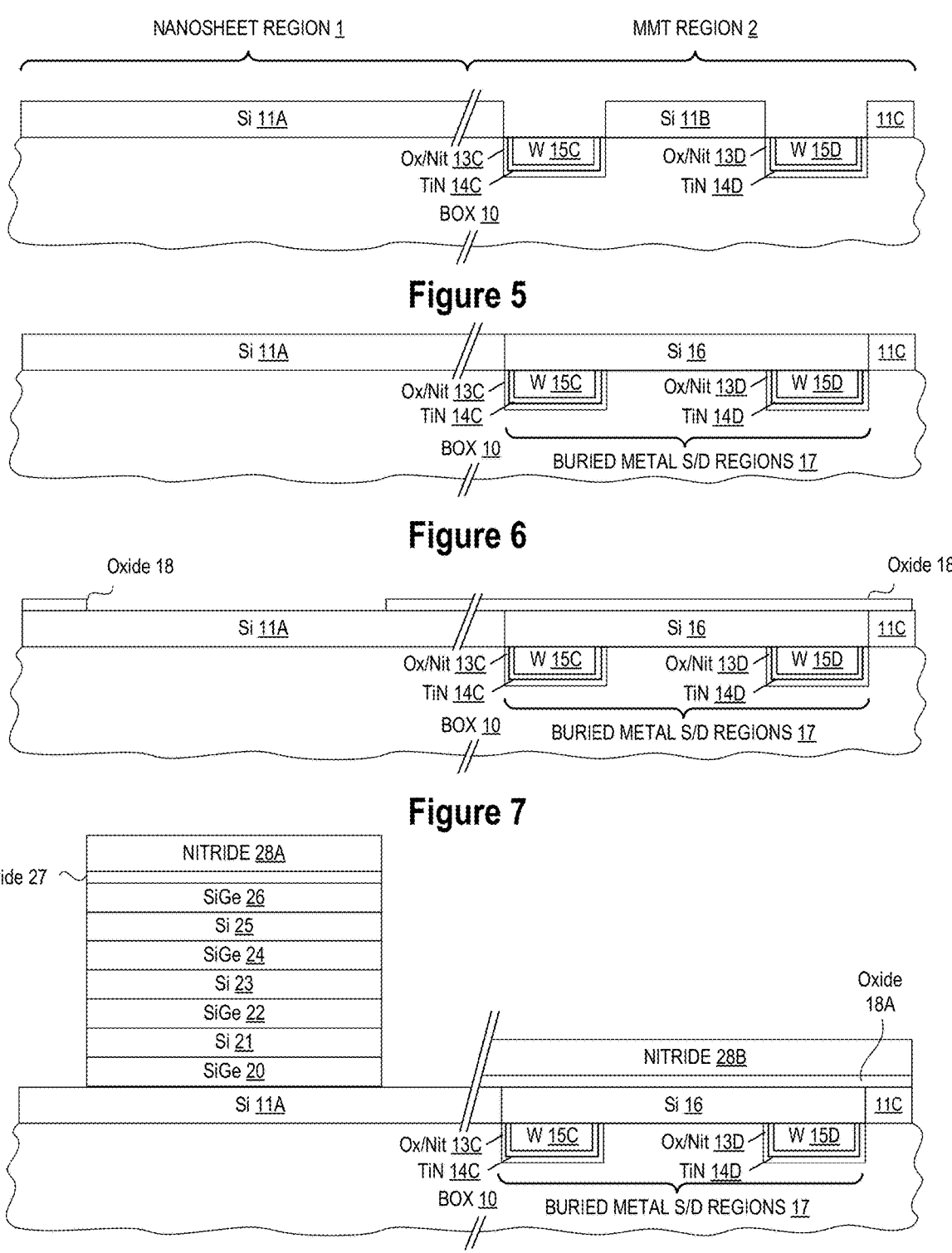
FIG. 5 illustrates processing subsequent to FIG. 4 after recessing the one or more metal source/drain layers below the semiconductor layer to form recessed buried metal source/drain structures in accordance with selected embodiments of the present disclosure.
FIG. 6 illustrates processing subsequent to FIG. 5 after epitaxially growing and polishing a semiconductor channel layer over the recessed buried metal source/drain structures in accordance with selected embodiments of the present disclosure.
FIG. 7 illustrates processing subsequent to FIG. 6 after forming a masking oxide layer over at least the MMT region in accordance with selected embodiments of the present disclosure.
FIG. 8 illustrates processing subsequent to FIG. 7 after patterning and etching a Si/SiGe superlattice of alternating silicon nanosheets and silicon germanium nanosheets to form a nanosheet transistor stack over the nanosheet region in accordance with selected embodiments of the present disclosure.

FIG. 5 illustrates processing of the semiconductor structure subsequent to FIG. 4 after recessing the one or more metal source/drain layers 13A-15A, 13B-15B below the semiconductor layer 11 to form recessed buried metal source/drain structures 13C-15C, 13D-15D in accordance with selected embodiments of the present disclosure. While any suitable recess etch process(es) may be used, in selected embodiments, the metal source/drain layers 13A-15A, 13B-15B may be selectively recess etched by applying one or more reactive-ion etching (RIE) steps having suitable etch chemistry properties to remove the upper portions of the metal source/drain layers 13A-15A, 13B-15B while leaving in place the semiconductor layers 11A-C and recessed buried metal source/drain structures 13C-15C, 13D-15D. In selected embodiments, the recess etch process is controlled to stop at the top of the buried oxide substrate layer 10, but the depth of the recess etch can be adjusted to remove more or less of the upper portions of the metal source/drain layers 13C-15C, 13D-15D, provided that the remnant semiconductor (Si) layers 11A-C extend above the recessed buried source/drain structures 13C-15C, 13D-15D. At this point in the fabrication sequence, the recessed buried metal source/drain structures 13C-15C, 13D-15D form buried metal source/drain regions 17 below the semiconductor channel layer 16. While the recess etching process will clear the top of the metal source/drain layers 15C, 15D, there may be additional cleaning processes required to clear the top surfaces of the recessed buried metal source/drain structures 13C-15C, 13D-15D. In other embodiments, one or more liner layers (not shown) may be included to promote good ohmic contact to the subsequently-formed epitaxial semiconductor channel layer 16.

FIG. 6 illustrates processing of the semiconductor structure subsequent to FIG. 5 after epitaxially growing and polishing a semiconductor channel layer 16 over the recessed buried metal source/drain structures 13C-15C, 13D-15D in accordance with selected embodiments of the present disclosure. While any suitable fabrication sequence may be used, the semiconductor channel layer 16 may be formed by using the remnant semiconductor layers 11A-C to epitaxially grow or deposit a semiconductor layer (e.g., silicon) on the semiconductor structure to completely cover the recessed buried metal source/drain structures 13C-15C, 13D-15D in the MMT region 2. As will be appreciated, the epitaxial silicon deposition or growth process forms the semiconductor channel layer 16 from the remnant monocrystalline silicon layers 11A-C. Subsequently, one or more etch or polish steps may be applied to planarize the top surface of the epitaxial semiconductor channel layer 16 with the remnant semiconductor (Si) layers 11A-C. In other embodiments, an oxide mask layer (not shown) may be formed over the remnant semiconductor layer 11A in the nanosheet region 1 to block the epitaxial growth in that region when forming the semiconductor channel layer 16.

FIG. 7 illustrates processing of the semiconductor structure subsequent to FIG. 6 after forming a masking oxide layer 18 over at least the MMT region 2 in accordance with selected embodiments of the present disclosure. Depending on the requirements for protecting the nanosheet region 1, the masking oxide layer 18 may be formed by depositing or otherwise forming a protective masking layer over the semiconductor structure using chemical vapor deposition (CVD), plasma-enhanced chemical vapor deposition (PECVD), physical vapor deposition (PVD), atomic layer deposition (ALD), thermal oxidation, or any combination(s) of the above to a thickness of approximately 20-200 Angstroms, though a thinner or thicker oxide layer may also be used. In addition, the masking oxide layer 18 may be selectively patterned and etched to expose the semiconductor (Si) layer 11 in at least part of the nanosheet region 1 using any suitable selective etch process, such as by depositing, patterning, etching or developing a photoresist or hard mask layer on the oxide layer 18.

FIG. 8 illustrates processing of the semiconductor structure subsequent to FIG. 7 after patterning and etching a Si/SiGe superlattice of alternating silicon nanosheets and silicon germanium nanosheets to form a nanosheet transistor stack 20-26 covered by an oxide layer 27 over the nanosheet region 1 in accordance with selected embodiments of the present disclosure. Depending on the requirements for protecting the nanosheet transistor stack 20-26 against subsequent oxide etch steps, an additional protective nitride layer 28A may also be formed on the protective oxide layer 27. As will be appreciated, any suitable sequence of processing steps may be used to form the Si/SiGe superlattice on the remnant semiconductor layer 11A, such as by epitaxially growing a plurality of nanosheet semiconductor layers of alternating silicon germanium (SiGe) and silicon (Si) which are subsequently patterned and etched to form the nanosheet transistor stack. As shown, the depicted Si/SiGe superlattice is a stack of alternating layers which includes a first group of layers 20, 22, 24, 26 that include silicon germanium, and a second group of layers 21, 23, 25 that include silicon. While the Si/SiGe superlattice is shown with four silicon germanium nanosheets 20, 22, 24, 26, it will be appreciated that the number of silicon germanium nanosheets may be decreased or increased (e.g., 5 SiGe nanosheets) to optimize transistor performance. If desired, the individual layers of the Si/SiGe superlattice may be doped or implanted with impurities to control the conductivity of the Si/SiGe superlattice.

After forming the Si/SiGe superlattice 20-26, a first oxide layer 27 is deposited or otherwise formed over the semiconductor structure using any suitable process (e.g., CVD, PECVD, PVD, ALD, thermal oxidation, or any combination(s) thereof). In addition, a protective insulator or dielectric may be formed on the semiconductor structure to cover the protective oxide layer 27 in the nanosheet and MMT regions 1, 2, such as by depositing or otherwise forming a protective nitride layer 28 to a predetermined thickness. Subsequently, the Si/SiGe superlattice 20-26, oxide layer 27, and protective nitride layer 28 are patterned and etched to form the nanosheet transistor stack 20-26 which includes the oxide layer 27 and protective nitride layer 28A on top. While any suitable pattern and etch process may be used, a first patterned mask (not shown) may be formed on the semiconductor structure by depositing, patterning, etching or developing a photoresist or hard mask layer on the protective nitride layer 28 to protect selected portions of the nanosheet and MMT regions 1, 2. With the first patterned mask in place, one or more etch processes may then be applied to create the nanosheet transistor stack 20-26, along with the remnant oxide layer 27 and nitride layer 28A in the nanosheet region 1. The application of the one or more etch processes may also create the remnant nitride layer 28B and underlying oxide layer 18A in the MMT region 2. The etch processing can include a sequence of reactive-ion etching (RIE) steps having suitable etch chemistry properties to remove, in sequence, the exposed portions of the protective nitride layer 28, oxide layer 27, and underlying layers of the Si/SiGe superlattice 20-26. As will be appreciated, the sidewalls of the resulting nanosheet transistor stack 20-26 are substantially vertical, though minor deviations in the sidewall profile may occur at each layer due to etch processing variations.

Figure 9:
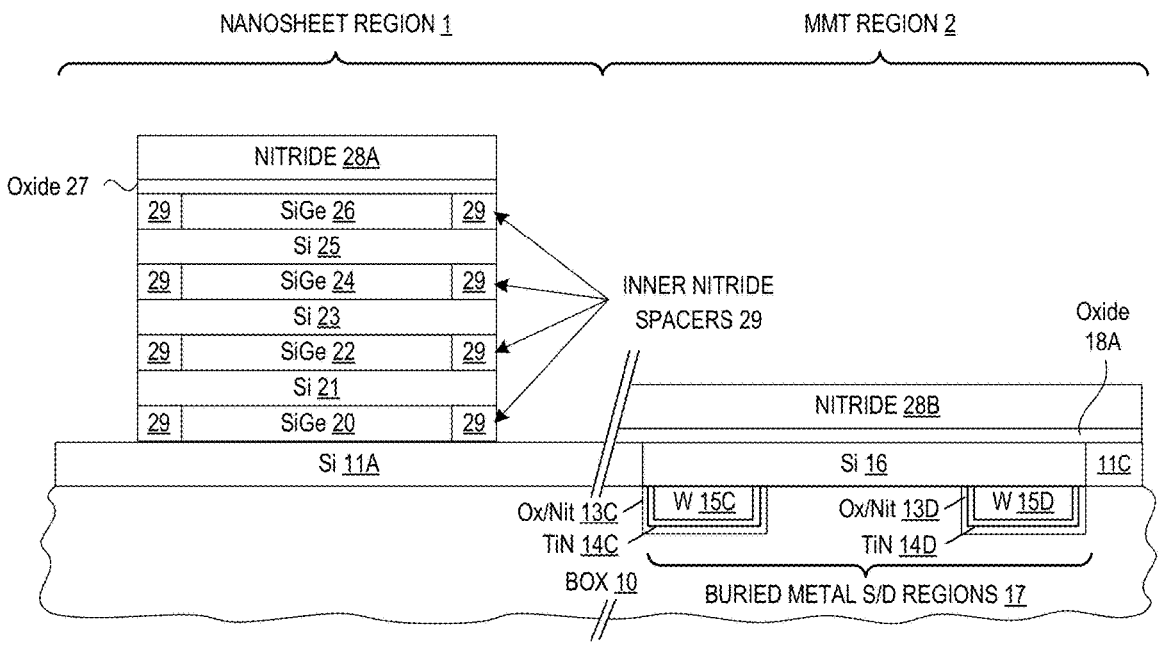
FIG. 9 illustrates processing subsequent to FIG. 8 after forming inner nitride spacers on sidewalls of the nanosheet transistor stack in accordance with selected embodiments of the present disclosure.

FIG. 9 illustrates processing of the semiconductor structure subsequent to FIG. 8 after forming inner nitride spacers 29 on sidewalls of the nanosheet transistor stack 20-26 in accordance with selected embodiments of the present disclosure. While any suitable fabrication sequence may be used, the inner nitride spacers 29 may be formed by selectively recessing the SiGe layers 20, 22, 24, 26 to form recess openings on the exposed sides of the nanosheet transistor stack. While any suitable SiGe etch process may be used, a controlled SiGe recess etch process, such as a timed isotropic dry etch, may be used to remove a portion of each SiGe layer 20, 22, 24, 26 from the exposed sides of the nanosheet transistor stack. At the conclusion of the etching process, the remnant SiGe portions 20, 22, 24, 26 remain where the recess openings have not been formed, and will define a first gate length dimension Lg for the subsequently formed nanosheet transistor. As will be appreciated, the etched sidewall edges of the remnant SiGe portions 20, 22, 24, 26 may have a substantially vertical or slightly curved profile resulting from the selective SiGe recess etch.

After forming the recess openings in the SiGe layers 20, 22, 24, 26, one or more dielectric layers are deposited or otherwise formed over the semiconductor structure to fill the recess openings, and then subsequently etched to remove the dielectric layer(s) from the top and sides of the nanosheet transistor stack but leaving remnant dielectric spacers 29. For example, a nitride layer may be deposited over the semiconductor structure to a predetermined thickness that is sufficient to cover at least the nanosheet transistor stack 20-26 and fill the recess openings on the exposed sides thereof. By applying an isotropic nitride etch process (e.g., RIE) to remove the nitride layer from the top and sides of the nanosheet transistor stack 20-26, the remnant inner nitride spacers 29 are formed as sidewall spacers. As will be appreciated, the etched sidewall edges of the remnant nitride spacers 29 may have a substantially vertical or slightly curved profile resulting from the applied isotropic nitride etch process.

Figure 10:
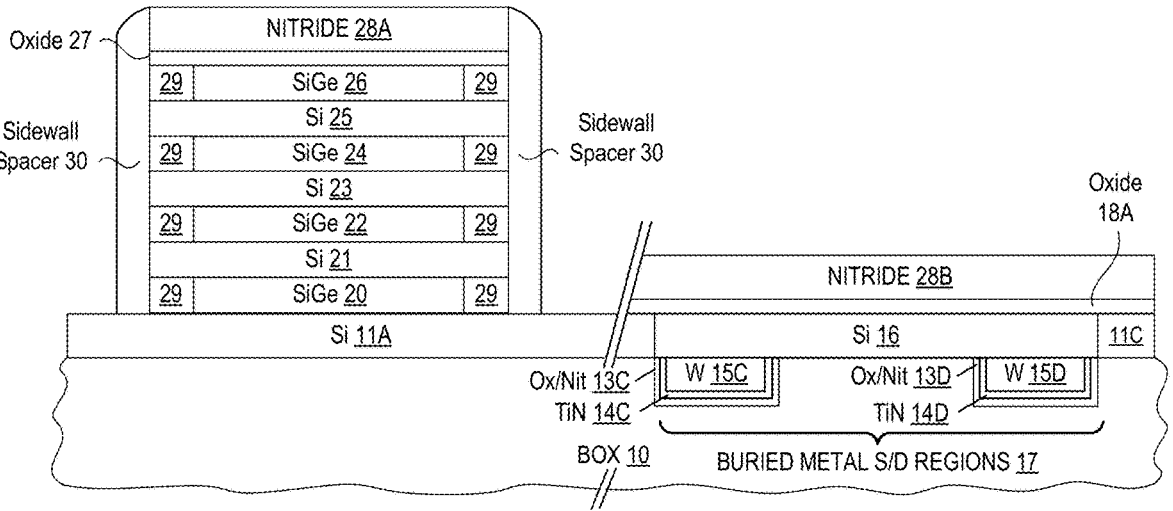
FIG. 10 illustrates processing subsequent to FIG. 9 after forming dielectric sidewall spacers on the sidewalls of the nanosheet transistor stack in accordance with selected embodiments of the present disclosure.

FIG. 10 illustrates processing of the semiconductor structure subsequent to FIG. 9 after forming dielectric sidewall spacers 30 on the sidewalls of the nanosheet transistor stack in accordance with selected embodiments of the present disclosure. While any suitable spacer formation sequence may be used, the sidewall spacers 30 may be formed by depositing one or more dielectric layers, such as an oxide layer, over the semiconductor structure, and then applying an anisotropic etch process to remove the dielectric layer(s) from the horizontal surfaces of the semiconductor structure, but leaving remnant sidewall spacers 30 at the sides of the nanosheet transistor stack 20-26 and the patterned protective nitride layers 28A, 28B (not shown).

Figure 11:
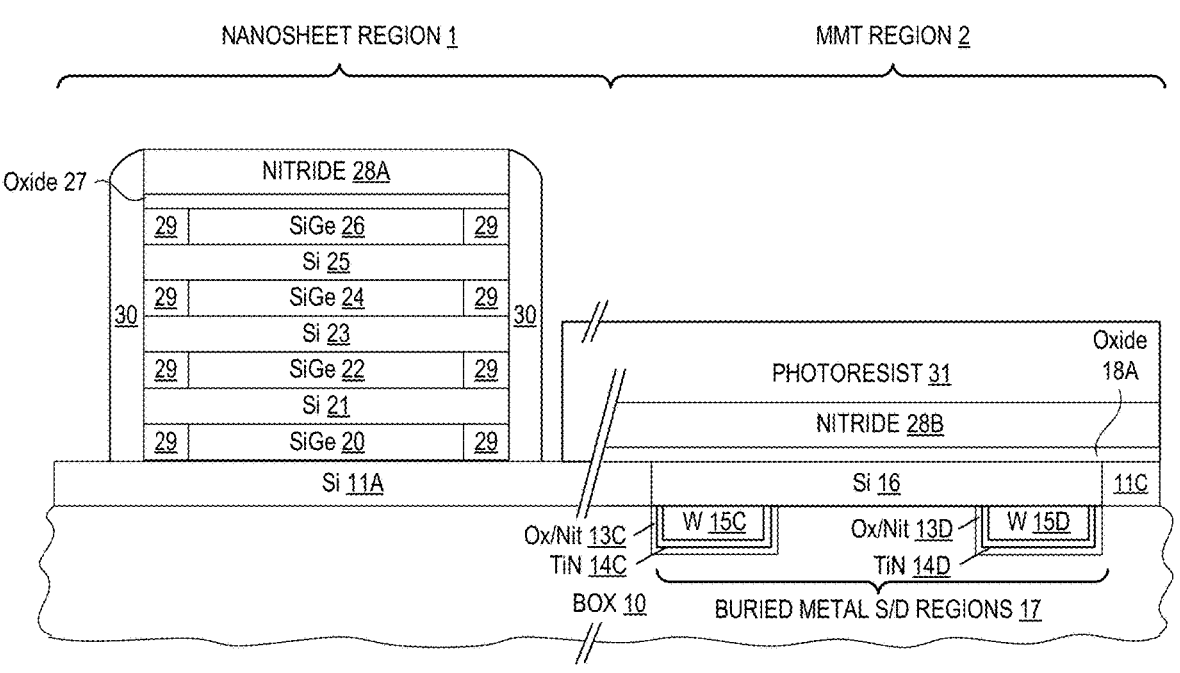
FIG. 11 illustrates processing subsequent to FIG. 10 after forming a photoresist mask to cover the MMT region in accordance with selected embodiments of the present disclosure.

FIG. 11 illustrates processing of the semiconductor structure subsequent to FIG. 10 after forming a photoresist mask 31 to cover the MMT region 2 in accordance with selected embodiments of the present disclosure. Though not illustrated, the photoresist mask 31 is defined to also protect exposed ends of the nanosheet transistor stack 20-26 (in the z-direction). In this way, the photoresist mask 31 protects the semiconductor channel layer 16 in the MMT region 2 and the silicon layers 21, 23, 25 in the nanosheet transistor stack from subsequent silicon etch processing steps. As shown, the patterned photoresist layer 31 is formed to leave an opening adjacent to the sidewall spacers 30 on the nanosheet transistor stack which exposes the bottom silicon nanosheet layer 11A.

Figure 12:
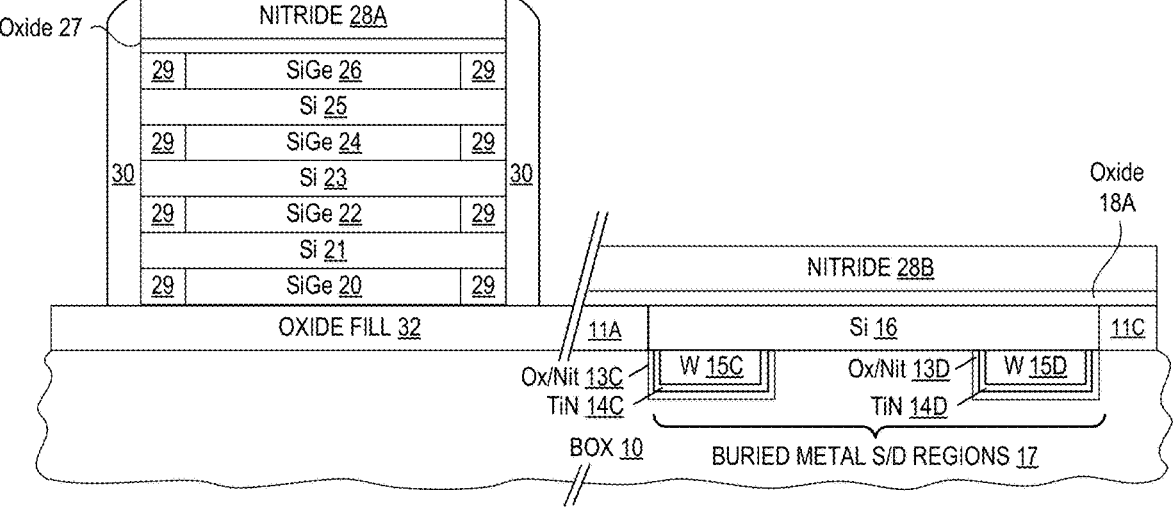
FIG. 12 illustrates processing subsequent to FIG. 11 after forming an oxide fill layer to replace the semiconductor layer in at least a part of the nanosheet region in accordance with selected embodiments of the present disclosure.

FIG. 12 illustrates processing of the semiconductor structure subsequent to FIG. 11 after forming an oxide fill layer 32 to replace at least part of the semiconductor layer 11A in at least a part of the nanosheet region 1 in accordance with selected embodiments of the present disclosure. While any suitable process may be used to form the replacement oxide fill layer 32, in selected embodiments, a suitable lateral silicon etch (e.g., isotropic silicon wet etch) is applied with the patterned photoresist layer 31 in place to remove the bottom silicon nanosheet layer 11A except for stack ends in the width dimension (e.g., perpendicular to the gate length dimension) that remain to support the nanosheet transistor stack 20-26. After etching at least a portion of the bottom silicon nanosheet layer 11A, the resulting opening is filled with one or more oxide layers to form the replacement oxide fill layer 32. For example, one or more conformal CVD oxide layers may be formed to fill the opening and form the replacement oxide fill layer 32. The remnant stack ends of the bottom silicon nanosheet layer 11A can be etched away in subsequent processing.

Figure 13:
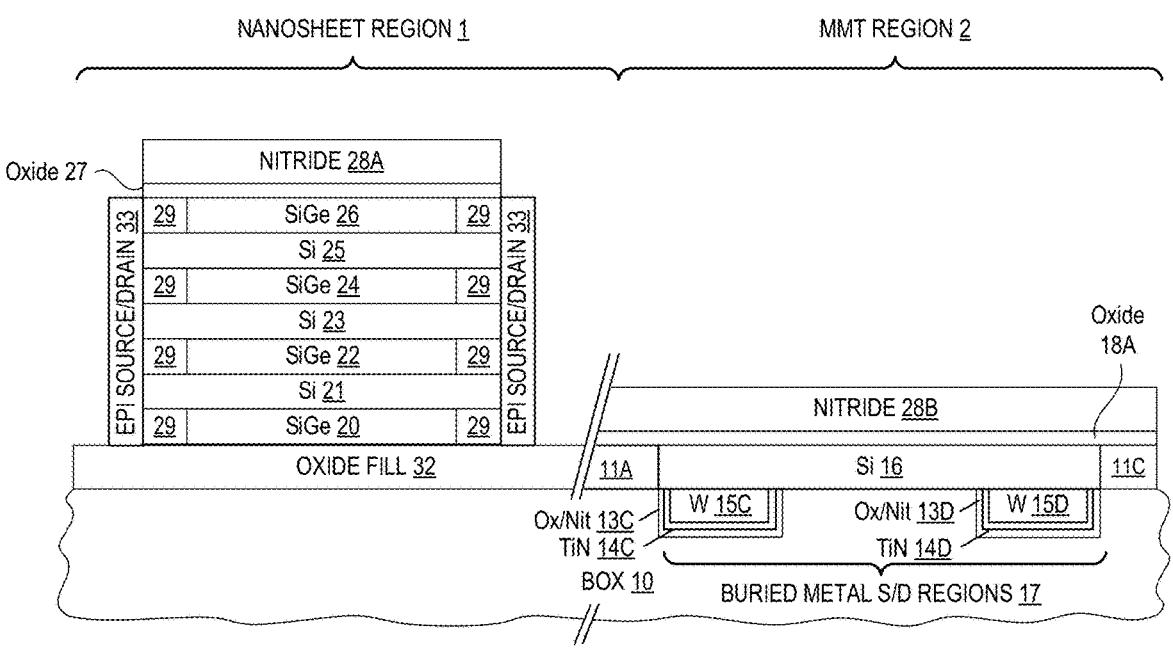
FIG. 13 illustrates processing subsequent to FIG. 12 after epitaxially growing and doping or implanting source/drain regions adjacent to the nanosheet transistor stack in accordance with selected embodiments of the present disclosure.

FIG. 13 illustrates processing of the semiconductor structure subsequent to FIG. 12 after epitaxially growing and doping or implanting source/drain regions 33 adjacent to the nanosheet transistor stack 20-26, 29 in accordance with selected embodiments of the present disclosure. As depicted, at this point in the fabrication sequence, the sidewall spacers 30 must be removed before forming the epitaxial source/drain regions 33 by using a suitable isotropic oxide etch chemistry. While any suitable source/drain fabrication sequence may be used, the source/drain regions 33 may be formed by using the silicon layers 21, 23, 25 to epitaxially grow or deposit a semiconductor layer (e.g., silicon) in the regions adjacent to the nanosheet transistor stack. As will be appreciated, the epitaxial silicon deposition or growth process forms the epitaxial source/drain regions 33 from the exposed silicon layers 21, 23, 25. At this point, the epitaxial source/drain regions 33 can be doped using any suitable doping technique. For example, the epitaxial source/drain regions 33 may be in-situ doped during the epi process, such as by doping epitaxially grown source/drain features with boron, arsenic and/or phosphorus to form doped epitaxial source/drain regions 33. In some embodiments, the source/drain features are not in-situ doped, and instead an implantation process is performed to dope the epitaxial source/drain regions 33. As will be appreciated, the doping dose used to dope the epitaxial source/drain regions 33 is greater than a doping dose (if any) used to dope the channel regions in the silicon layers 21, 23, 25. In addition, processing of the source/drain regions 33 may be performed in separate processing sequences for each of N-type and P-type source/drain features. In some embodiments, after formation of the source/drain regions 33, an epi anneal process may be performed to promote formation of crystalline structures in the epitaxial source/drain regions 33, such as by applying a high thermal budget process. In addition, one or more selective etch steps may be applied so that the epitaxial source/drain regions 33 have a uniform thickness.

Figure 14:
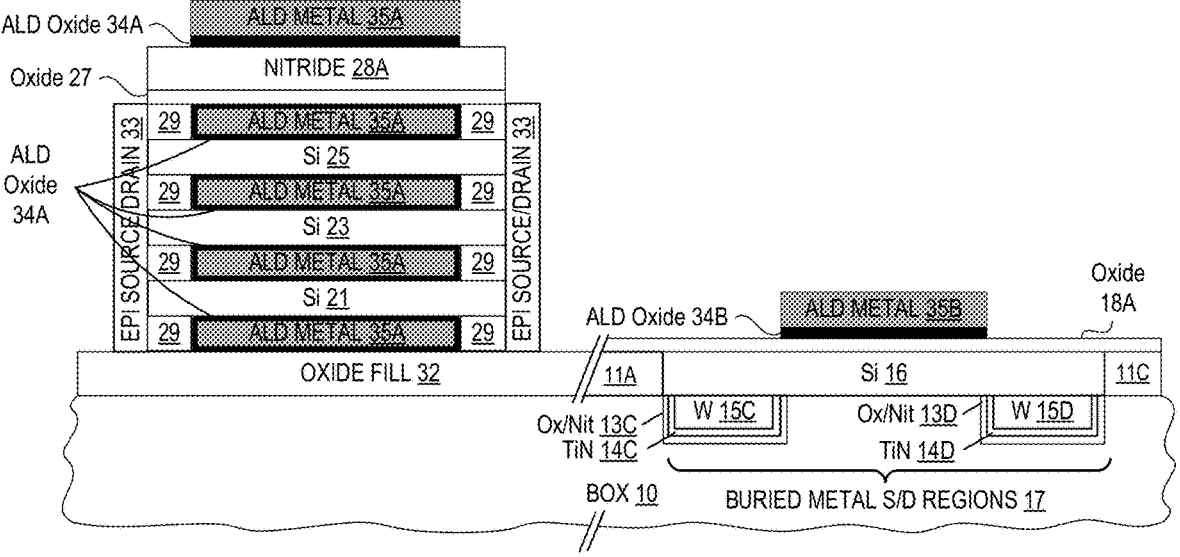
FIG. 14 illustrates processing subsequent to FIG. 13 after forming nanosheet gate electrode structures in the nanosheet transistor stack and a first MMT control gate electrode structure by sequentially forming an atomic layer deposition (ALD) oxide layer and ALD metal layer in accordance with selected embodiments of the present disclosure.

FIG. 14 illustrates processing of the semiconductor structure subsequent to FIG. 13 after forming gate electrode structures 34A, 35A in the nanosheet region 1 and a MMT control gate electrode structure 34B, 35B in the MMT region 2 by sequentially forming an atomic layer deposition (ALD) oxide layer 34 and ALD metal layer 35 in accordance with selected embodiments of the present disclosure. While any suitable fabrication sequence may be used to form the gate electrode structures, the processing may begin by patterning and etching the nanosheet transistor stack with an active photo/etch and SiGe access process to expose the SiGe layers 20, 22, 24, 26 in the nanosheet transistor stack to a subsequent SiGe etch process. While the depicted cross-sectional drawing does not show etch openings that expose the SiGe layers 20, 22, 24, 26, it will be appreciated that the etch openings may be formed in the z-axis plane (in and out of the paper) to expose peripheral ends of the SiGe layers 20, 22, 24, 26. In addition, the active photo/etch and SiGe access process may include forming a patterned mask (not shown) over the semiconductor structure by depositing, patterning, etching or developing a photoresist or hard mask layer on the epitaxial source/drain regions 33 and the nitride layer 28A over the nanosheet transistor stack.

With the openings formed in the patterned photoresist/ hard mask, the active photo/etch and SiGe access process may then apply one or more etch processes that are applied through the patterned photoresist/hard mask to etch and remove at least the exposed SiGe layers 20, 22, 24, 26. The etch processing can include performing a sequence of reactive-ion etching (RIE) steps having suitable etch chemistry properties to selectively etch and remove the exposed SiGe layers 20, 22, 24, 26. While any suitable SiGe etch process may be used, a selective isotropic SiGe etch process, such as a timed isotropic dry etch, may be used to remove the exposed remnant SiGe layers 20, 22, 24, 26 from the transistor stack. At the conclusion of the SiGe etching process, the remnant SiGe layers 20, 22, 24, 26 of the nanosheet transistor stack are replaced by gate openings where the gate electrodes will be formed in the nanosheet transistor stack. At this point, a patterned photoresist mask layer may be formed over the nanosheet region 1 and the protective nitride layer 28B in the MMT region 2 may be selectively etched and removed. The oxide layer 18A may also be patterned and etched at this time to define a remnant oxide layer over the semiconductor channel layer 16 of the MMT region 2, though this not necessarily required.

After forming the gate openings in the nanosheet transistor stack, a conformal gate dielectric layer 34 is deposited over the semiconductor structure, thereby forming a liner layer 34A in at least the gate openings of the nanosheet transistor stack in the nanosheet region 1. The deposition of the conformal gate dielectric layer 34 also covers the oxide layer 18A in the MMT region 2. In selected embodiments, the conformal gate dielectric layer 34 is formed with an atomic layer deposition (ALD) to conformally deposit an ALD oxide layer 34A to a desired gate dielectric thickness (e.g., 5-50 Angstroms) on the interior surfaces of the gate openings without completely filling the gate openings. In selected embodiments, the ALD oxide deposition process may be implemented by exposing the semiconductor structure to a precursor, evacuating or purging the precursors as well as byproducts from the chamber, exposing the semiconductor structure to reactant species (e.g., oxidants or other reagents), and evacuating or purging the reactants and byproduct molecules from the chamber. As a result, the ALD oxide deposition process offers accurate control of film thickness and composition as well as the ability to achieve excellent uniformity over large areas at relatively low temperatures. In addition to forming gate dielectric layer 34A in the gate openings, the resulting ALD oxide 34 forms a substantially conformal gate dielectric layer over the upper surface of the semiconductor structure, including forming an ALD oxide layer 34B on the oxide layer 18A.

After forming the conformal gate dielectric layer 34, one or more conductive gate electrode layers are formed in the nanosheet region 1 to cover the nanosheet transistor stack and to at least fill the remaining gate openings of the nanosheet transistor stack and to cover the MMT region 1. In selected embodiments, the conductive gate electrode layer(s) 35 are formed with an atomic layer deposition (ALD) process to conformally deposit at least a first ALD metal layer 35A to a sufficient thickness on the ALD oxide layers 34A to fill the remaining gate openings in the nanosheet transistor stack. In selected embodiments, the ALD metal deposition process may be implemented by exposing the semiconductor structure to a precursor, evacuating or purging the precursors as well as byproducts from the chamber, exposing the semiconductor structure to reactant species (e.g., metals or other reagents), and evacuating or purging the reactants and byproduct molecules from the chamber. In addition to forming gate electrode layers 35A in the gate openings, the ALD metal process forms an ALD metal layer as a substantially conformal layer over the upper surface of the semiconductor structure, including forming an ALD metal layer 35B on the ALD oxide layer 34B.

After forming the conductive gate electrode layer(s), one or more etch processes are applied to selectively pattern the ALD metal layer 35 and ALD oxide layer 34 from the nanosheet region 1 and the MMT region 2. While any suitable etch process may be used, the etch processing can use a patterned etch mask to apply one or more isotropic metal etching steps (e.g., RIE) having suitable etch chemistry properties to leave only the ALD metal layers 35A, 35B on the surface of the semiconductor structure while leaving the underlying ALD oxide layer 34 in place. Subsequently, the etch processing can use a patterned etch mask to apply one or more isotropic and/or anisotropic oxide etching steps (e.g., RIE) having suitable etch chemistry properties to remove the ALD oxide layer 34 from the surface of the semiconductor structure to leave only patterned ALD oxide layers 34A, 34B in place under the gate electrodes 35A, 35B.

While not shown, there may be additional processing steps, such as formation of nitride sidewall spacers and/or silicidation of the gate electrode and/or epitaxial source/drain regions 33. However, at this point in the fabrication process, the fabrication of the nanosheet transistor in the nanosheet region 1 is substantially complete insofar as the nanosheet transistor includes a first gate electrode structure 34A, 35A formed around the nanosheet silicon channel layers 21, 23, 25 which connect the epitaxial source/drain regions 33. However, the MMT transistor in the MMT region 2 is not yet complete since only one of the control gate electrode structures 34B, 35B has been formed over the semiconductor channel layer 16 which connects the buried metal source/drain structures 13C-15C, 13D-15D. Accordingly, there are additional steps required to form the second control gate structure for the MMT device as described herein below.

Figure 15:
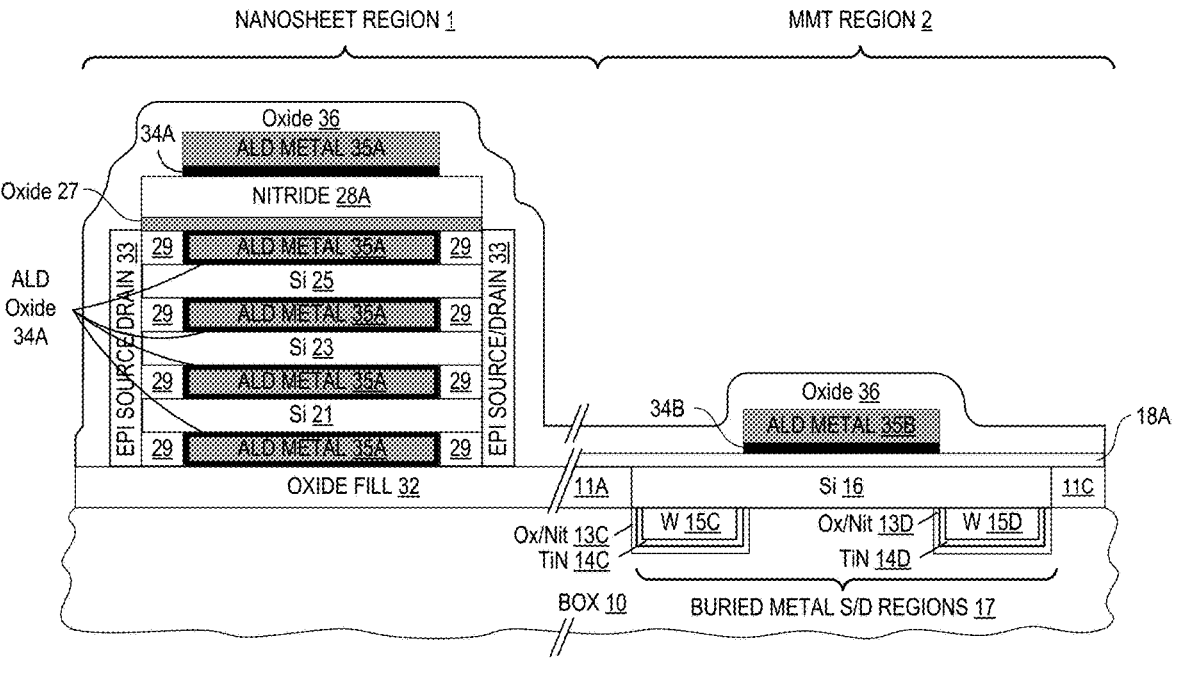
FIG. 15 illustrates processing subsequent to FIG. 14 after depositing an insulating oxide layer to cover the nanosheet and MMT regions in accordance with selected embodiments of the present disclosure.

FIG. 15 illustrates processing of the semiconductor structure subsequent to FIG. 14 after depositing an insulating layer 36 to cover the nanosheet and MMT regions 1, 2 in accordance with selected embodiments of the present disclosure. While any suitable insulating layer deposition step may be used, in selected embodiments, one or more oxide or dielectric layers 36 may be formed over the semiconductor structure to cover the nanosheet region 1 and MMT region 2 so that the nanosheet transistor stack and first gate electrode structure 34A, 35A are conformally covered on the top and sidewall surfaces. In selected embodiments, the oxide layer(s) 36 may be deposited by using CVD, PECVD, PVD, ALD, or any combination(s) of the above to form a conformal oxide layer having a predetermined thickness (e.g., approximately 20-200 Angstroms) that will separate the second control gate structure from the first control gate structure and the semiconductor channel layer 16.

Figure 16:
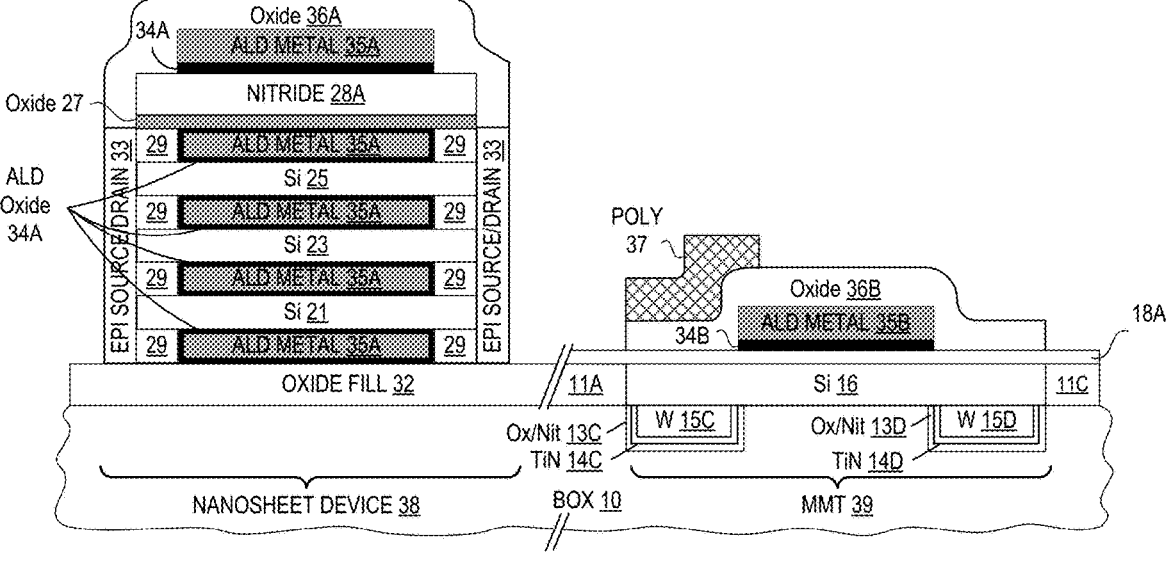
FIG. 16 illustrates processing subsequent to FIG. 15 after selectively forming a second MMT control gate over the insulating oxide layer in the MMT region in accordance with selected embodiments of the present disclosure.

FIG. 16 illustrates processing of the semiconductor structure subsequent to FIG. 15 after selectively forming a second MMT control gate structure 37 over the insulating oxide layer 36 in the MMT region in accordance with selected embodiments of the present disclosure. While any suitable poly gate formation process steps may be used, in selected embodiments, the second MMT control gate structure 37 may be formed on the insulating layer 36 by depositing a conductive polysilicon layer 37 to conformally cover the semiconductor structure, such as by using CVD, PECVD, PVD, ALD, or any combination(s) of the above) to a predetermined thickness which covers the top and sidewall surfaces of the semiconductor structure. The deposited first polysilicon layer 37 may then be selectively etched by forming a patterned photoresist or etch mask and applying a sequence of reactive-ion etching (RIE) steps having suitable etch chemistry properties to leave only the patterned polysilicon layer 37 in place as the second MMT control gate structure 37 for the MMT device. In defining the position of the patterned polysilicon layer 37 which forms the MMT control gate structure, the interior or rightmost sidewall edge of the second MMT control gate structure 37 is roughly aligned to have a minimum specified overlap with the leftmost sidewall edge of the first MMT control gate structure 35B.

As a result of the processing steps illustrated in FIGS. 1-16, there is provided a nanosheet transistor device 38 which is integrated with an MMT device 39 on a single die with a single nanosheet process flow, thereby providing a straightforward method for integrating MMT devices with advanced nanosheet transistors on the same die. While specific implementation details are described herein for integrating the fabrication of MMT devices with the nanosheet transistor process flow to make dual use of fabrication steps, it will be appreciated that additional or fewer processing steps may be used and/or combined. For example, depending upon the electrical connection and structure of the source/drain regions 33, gate electrodes 35A, polysilicon MMT control gate structures 37, metal MMT control gate 35B, and buried metal source/drain structures 15C, 15D, the semiconductor structure may be configured in a number of different circuit configurations. In a first example configuration, the metal gate electrode 35A of a first nanosheet transistor may be directly electrically connected to a polysilicon MMT control gate structure 37 of an MMT device and to a metal gate electrode 35A of a second nanosheet transistor. In addition or in the alternative, one or more buried conductor structures (not shown) may be formed as part of the backside power distribution network to electrically connect either or both of the buried metal source/drain structures 15C, 15D to other circuit elements, such as a control electrode (e.g., gate or source/drain) in another nanosheet transistor.

Figure 17:
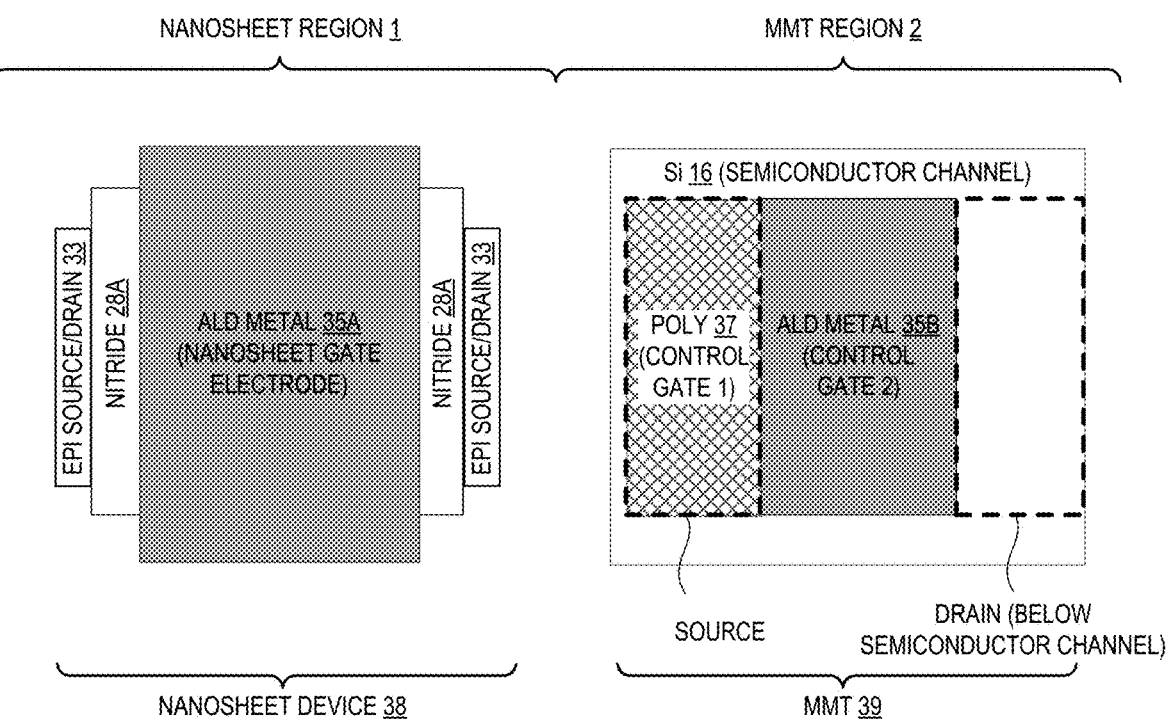
FIG. 17 illustrates simplified plan views of the nanosheet transistor device and MMT device in accordance with selected embodiments of the present disclosure.

To provide additional details for an improved understanding of the present disclosure, reference is now made to FIG. 17 which illustrates simplified plan views of the nanosheet transistor device 38 and MMT device 39 formed in accordance with selected embodiments of the present disclosure. While not every device feature or layer is shown in the simplified plan views, it can be seen that the nanosheet transistor device 38 includes the ALD metal gate electrode 35A which is a gate-all-around electrode that extends down the sides of the Si/SiGe epi stack (not visible) which is covered by the protective nitride layer 28A. In addition, the nanosheet transistor device 38 includes epi source/drain regions 33 which are connected across the silicon nanosheet layers 21, 23, 25 in the Si/SiGe epi stack (not visible) which is covered by the protective nitride layer 28A. In addition, it can be seen that the MMT device 39 includes the patterned poly layer 37 (which is a first control gate) and the ALD metal gate electrode 35B (which is a second control gate) which are positioned over the silicon semiconductor channel layer 16 to control current flow between the buried metal source and drain structures (shown with dashed lines). In this configuration, the patterned poly layer 37 (first control gate) controls the amount of current flow in the MMT device 39, and the ALD metal gate electrode 35B (second control gate) turns the semiconductor channel region 16 "on" or "off."

Figure 18:
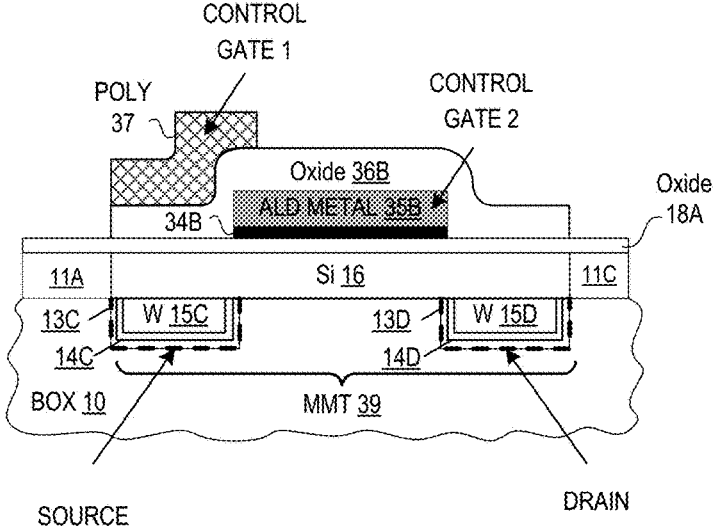
FIG. 18 is a partial cross-sectional view of an MMT device formed in accordance with selected embodiments of the present disclosure.

To illustrate an example implementation of an MMT device formed in accordance with selected embodiments of the present disclosure, reference is now made to FIG. 18 which depicts a partial cross-sectional view of an MMT device which includes a source 15C and drain 15D which are formed in the buried oxide substrate layer 10 below the semiconductor channel region 16 which is controlled by the first MMT control gate structure 37 and the second MMT control gate structure 35B. The construction of buried source/drain regions in the buried oxide substrate layer 10 eliminates the sidewall charge injection problem that would arise if the semiconductor channel were located between the source and drain regions. As a result, the overall charge injection of the MMT device is more uniform and possibly more linear than conventional thin film transistor devices. Another benefit of the MMT device design is that, by virtue of the metal source/drain structures, the MMT device is a majority carrier device that utilizes characteristics of Schottky junctions and MOSFETs to operate. In particular, for an n-type semiconductor channel region 16, if the first MMT control gate structure 37 receives a positive voltage when a ground voltage is applied to the second MMT control gate structure 35B, there is no current conducted across the semiconductor channel region 16 between the source and drain regions. In addition, if the second MMT control gate structure 35B receives a positive voltage when a ground voltage is applied to the first MMT control gate structure 37, the conducting channel in the semiconductor channel region 16 is turned on, but even with a large source-drain voltage VDS, there is no current flow between the source and drain regions. However, if a positive voltage is applied to both the first MMT control gate structure 37 and the second MMT control gate structure 35B, current will flow across the semiconductor channel region 16 between the source and drain regions, and the magnitude of the current flow will be set explicitly by the voltage on the first MMT control gate structure 37 and nothing else.

Turning now to FIG. 19, there is illustrated a simplified process flow 100 for integrating the fabrication of nanosheet transistor devices and MMT devices in accordance with selected embodiments of the present disclosure. Stated generally, the process includes an initial set of fabrication steps 110 to fabricate a wafer substrate with buried power rail/source/drain structures formed below an epitaxial semiconductor channel in an MMT region of the wafer substrate. A second set of fabrication steps 120 form nanosheet transistor stacks in a nanosheet region of the wafer substrate by fabricating a Si/SiGe superlattice structure of alternating silicon nanosheets and silicon germanium nanosheets that are patterned and etched to form the nanosheet transistor stacks. A third set of fabrication steps 130 processes the nanosheet transistor stacks to partially etch exposed SiGe nanosheets and form recess openings in the Si/SiGe superlattice which are filled with inner nitride spacers to define remnant SiGe nanosheets. A fourth set of fabrication steps 140 masks or protects the MMT region of the wafer substrate and the nanosheet transistor stacks before replacing semiconductor channel layer in the nanosheet region with a replacement dielectric layer. A fifth set of fabrication steps 150 forms epitaxial source/drain regions on the nanosheet transistor stacks. A sixth set of fabrication steps 160 selectively processes the nanosheet transistor stacks to remove the remnant SiGe nanosheet layers and to form gate etch openings, and then sequentially applies atomic layer deposition (ALD) oxide and metal layers to form transistor gate electrodes in the transistor stack and a first MMT metal control gate in the MMT region. A seventh set of fabrication steps 170 selectively processes the MMT region to form an MMT poly control gate for the MMT device. An eighth set of fabrication steps 180 apply any desired Middle End Of Line (MEOL) and Back End of Line (BEOL) processing to the wafer substrate.

As will be appreciated, each set of fabrication steps 110, 120, 130, 140, 150, 160, 170, 180 can be implemented in different embodiments using the processing steps disclosed herein or modifications thereto as will be understood by those skilled in the art. However, by way of illustrating selected example embodiments of the present disclosure, each set of fabrication steps 110, 120, 130, 140, 150, 160, 170, 180 is described hereinbelow with an example processing step sequence.

Starting with the initial set of fabrication steps 110, the process 100 may begin at step 111 by selectively etching power rail and source/drain openings through at least part of a semiconductor layer that is formed in at least a multimodal transistor (MMT) region of a wafer substrate. In selected embodiments, the power rail and source/drain openings are formed by depositing, patterning, and developing a photoresist layer to form a patterned photoresist or hard mask layer on the semiconductor layer, and then applying one or more etch processes to create the power rail and source/drain openings by etching through at least part of the semiconductor layer in the MMT region. The etch processing can include a sequence of reactive-ion etching (RIE) steps having suitable etch chemistry properties to sequentially remove exposed portions of the semiconductor layer.

The initial set of fabrication steps 110 may also include forming recessed buried metal power rails and source/drain structures in the power rail and source/drain openings at step 112. For example, an insulator layer (e.g., oxide or nitride), a liner layer (e.g., TiN), and a conductive metal layer (e.g., W) may be sequentially deposited to fill the power rail and source/drain openings, and then planarized or polished with a CMP process before applying a recess etch to form the recessed buried metal power rails and source/drain structures in the power rail and source/drain openings. The recess etch processing can include a timed RIE step which is controlled to remove exposed upper portions of the insulator, liner and conductive metal layers so that the recessed buried source/drain structures are recessed below the unetched portion of the semiconductor layer.

The initial set of fabrication steps 110 may also include forming a semiconductor channel layer over the recessed buried source/drain structures in the MMT region at step 113. For example, a first epitaxial silicon deposition or growth process may be used to selectively form a first epitaxial silicon layer over the recessed buried source/drain structures from unetched portions of the semiconductor layer. As formed, the first epitaxial silicon layer should be formed to the height of at least the semiconductor layer, either by a controlled epitaxial growth process or an overgrowth process coupled with epitaxial silicon etch and/or polish steps. As will be appreciated, the first epitaxial silicon region may be doped or implanted with N-type or P-type impurities.

The second set of fabrication steps 120 may include forming a stacked silicon/silicon germanium superlattice structure over the semiconductor layer in the nanosheet region of the wafer substrate at step 121. In selected embodiments, the silicon/silicon germanium superlattice structure is formed as a Si/SiGe epi stack by epitaxially growing alternating layers of Si and SiGe on a semiconductor substrate layer, and then covering the Si/SiGe epi stack by depositing an oxide protective layer and/or a protective nitride layer.

At step 122, the silicon/silicon germanium superlattice structure is processed with a gate length photo/etch process to form a nanosheet transistor stack. For example, a photoresist layer may be deposited, patterned, etched and developed to form a patterned photoresist or hard mask layer on the protective oxide or nitride layer. With the patterned photoresist/hard mask layer in place, the processing at step 122 may include applying one or more etch processes to create the nanosheet transistor stack. The etch processing can include a sequence of reactive-ion etching (RIE) steps having suitable etch chemistry properties to sequentially remove exposed portions of the protective oxide or nitride and underlying layers of the Si/SiGe epi stack.

The third set of fabrication steps 130 may include selectively recessing exposed SiGe nanosheets from the nanosheet transistor stack to form SiGe recess openings at step 131. For example, a controlled etch process, such as a timed isotropic dry etch, may be applied to selectively recess the SiGe layers exposed at the sides of the nanosheet transistor stack, thereby forming SiGe recess openings in the nanosheet transistor stack by partially recessing SiGe layers.

At step 132, first dielectric spacers are formed in the SiGe recess openings of the nanosheet transistor stack. For example, an inner nitride layer may be deposited over the semiconductor structure, and then patterned and isotropically etched to leave the inner nitride layer only in the SiGe recess openings of the nanosheet transistor stack.

The fourth set of fabrication steps 140 may include forming insulator spacers and/or photoresist/mask layers at step 141 to protect the nanosheet transistor stack sidewalls and MMT region against subsequent processing steps to replace the semiconductor channel layer in the nanosheet region with a replacement dielectric layer. For example, dielectric sidewall spacers may be formed on the sidewalls of the nanosheet transistor stack. In addition, a photoresist mask may be formed to cover the MMT region and to protect exposed ends of the nanosheet transistor stack (in the z-direction), thereby protecting the semiconductor channel layer in the MMT region and the silicon layers in the nanosheet transistor stack from subsequent silicon etch processing steps.

At step 142, the semiconductor layer in the nanosheet region is replaced with a replacement dielectric layer. For example, a suitable lateral silicon etch (e.g., isotropic silicon wet etch) is applied to selectively remove the semiconductor layer from below the nanosheet transistor stack except for stack ends in the width dimension (e.g., perpendicular to the gate length dimension) that remain to support the nanosheet transistor stack. After etching the semiconductor layer, the resulting opening is filled with one or more dielectric layers to form the replacement dielectric layer. For example, one or more conformal CVD oxide layers may be formed to fill the opening and form the replacement dielectric layer.

The fifth set of fabrication steps 150 may include one or more etch and/or clean steps 151 to remove the dielectric spacers and mask. For example, any suitable stripping process may be applied to remove photoresist materials, and the dielectric sidewall spacers may be selectively removed with a suitable oxide etch process.

At step 152, doped source/drain epitaxial layers are formed around and adjacent to the nanosheet transistor stacks. In selected embodiments, an epitaxial semiconductor process may be applied to form epitaxial semiconductor layers in the intended source/drain regions which may be doped, such as by using in-situ doping during the epitaxial semiconductor process and/or by implanting the epitaxial source/drain regions with N-type or P-type dopants, followed by one or more anneal processes to promote formation of crystalline structures in the epitaxial source/drain regions.

The sixth set of fabrication steps 160 for forming gate electrodes may include an active photo/etch step 161 to access the underlying SiGe layers in the nanosheet transistor stack. For example, a photoresist layer may be deposited, patterned, etched and developed to form a patterned photoresist or hard mask layer with mask openings positioned over the nanosheet transistor stack to access the underlying SiGe layers in the transistor stack. With the patterned photoresist/hard mask layer in place, the photo/etch process may include applying one or more etch processes to access the underlying SiGe layers in the nanosheet transistor stack. The etch processing can include a sequence of reactive-ion etching (RIE) steps having suitable etch chemistry properties to sequentially remove exposed portions of the underlying layers, but without removing the accessed SiGe layers.

At step 162, the SiGe layers at the exposed nanosheet transistor stack are selectively etched to form gate etch openings by removing the remnant SiGe layers in the nanosheet transistor stack. For example, a controlled etch process, such as a timed isotropic dry etch, may be applied to selectively etch and remove the SiGe layers exposed at the nanosheet transistor stack, thereby forming gate etch openings where the remnant SiGe layers were located in the nanosheet transistor stack.

At step 163, gate electrodes are formed on the MMT region and in the gate etch openings of the nanosheet transistor stack. For example, the gate electrodes may be formed by depositing an ALD oxide layer to form a conformal thin dielectric layer in the gate etch openings of the nanosheet transistor stack, and then depositing an ALD metal layer to form gate electrodes by filling the gate etch openings.

At step 164, the ALD metal and ALD oxide layers are patterned and etched to form the nanosheet gate stacks in the nanosheet transistor stack and to form the first MMT metal control gates in the MMT region. For example, a photoresist layer may be deposited, patterned, etched and developed to form a patterned photoresist or hard mask layer with mask openings such that a subsequent photo/etch process will sequentially remove exposed portions of the ALD metal layer and ALD oxide layer, leave only ALD metal layers on the surface of the nanosheet transistor stack where nanosheet gate electrodes are located and on the surface of the MMT region where the first MMT metal control gate(s) are located.

At this process stage, the front end of line processing of the nanosheet transistor stack is substantially complete. However, additional processing of the MMT region is required in order to form the second MMT poly control gate electrodes. To this end, the seventh set of fabrication steps 170 includes an oxide layer formation step 171. For example, one or more oxide layers having a predetermined thickness may be deposited by using CVD, PECVD, PVD, ALD, or any combination(s) of the above to form a conformal oxide layer over at least the first MMT metal control gate in the MMT region.

At step 172, a polysilicon layer is deposited on the oxide layer to cover at least the MMT region, and is then patterned and etched using any suitable selective etch processing sequence to form the second MMT poly control gate. For example, the deposited polysilicon layer may be selectively etched by forming a patterned photoresist or etch mask and applying a sequence of reactive-ion etching (RIE) steps having suitable etch chemistry properties to leave only the patterned polysilicon layer in place as the second MMT poly control gate structure for the MMT device. In defining the position of the patterned polysilicon layer which forms the second MMT poly control gate, there should be a minimum specified amount of overlap between the first MMT metal control gate and the second MMT poly control gate.

The eighth set of fabrication steps 180 may include any desired Middle End Of Line (MEOL) and Back End of Line (BEOL) processing steps to complete the fabrication of the nanosheet transistors and MMT devices into functioning devices. As examples, one or more sacrificial oxide formation, stripping, isolation region formation, spacer formation, heat drive or anneal steps, and polishing steps may be performed, along with MEOL and BEOL processing to form one or more levels of interconnect that are used to connect the transistors in a desired manner to achieve the desired functionality. Thus, the specific sequence of steps used to complete the fabrication of the nanosheet transistors and MMT devices may vary, depending on the process and/or design requirements.

Figure 20:
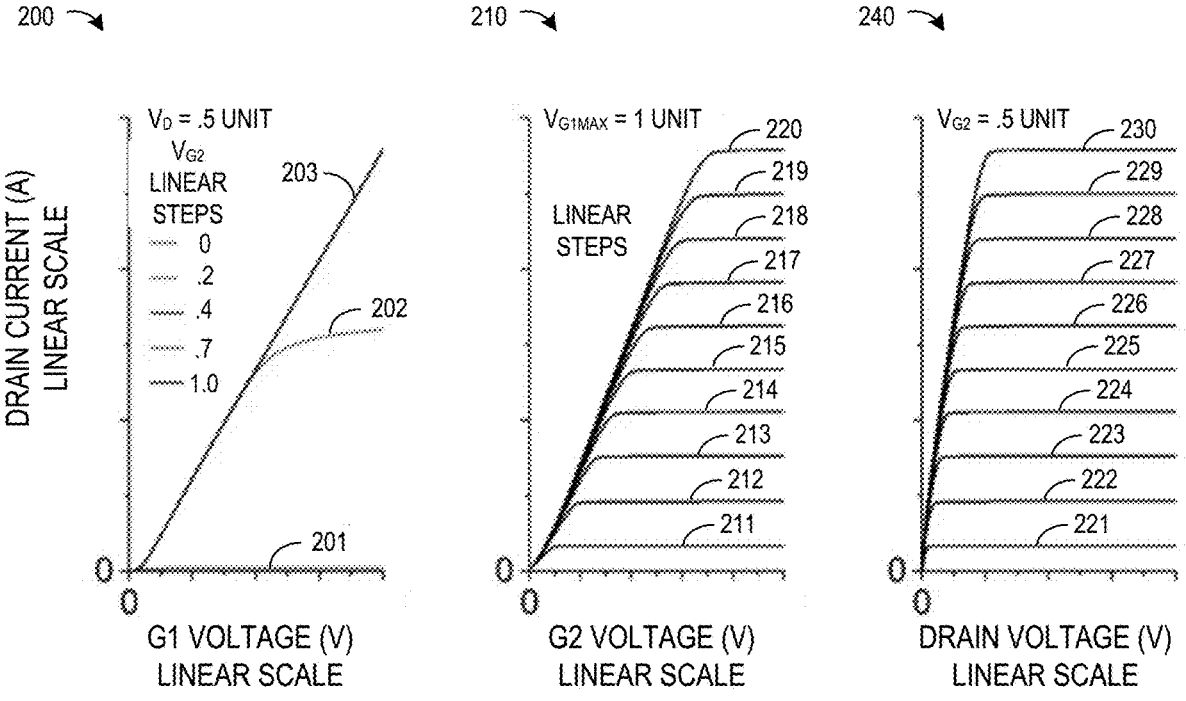
FIG. 20 illustrates MMT transfer characteristic plots to illustrate the operation of a multimodal transistor (MMT) device.

To provide additional details for an improved understanding of selected embodiments of the present disclosure, reference is now made to FIG. 20 which illustrates MMT transfer characteristic plots 200, 210, 240 to illustrate the operation of a multimodal transistor (MMT) device. Unlike other thin film field effect transistors, where a single gate electrode in the channel region is responsible for controlling both charge injection and switching functions, MMT devices use two control gates, one to control charge injection and one to control the switching function.

In particular, a first control gate (G1) is positioned to overlap with the buried source to solely control the magnitude of charge injection in the source-G1 overlap region (SGO), and is therefore referred to as the current control gate. Hence, the G1 transfer characteristic 200 resembles that of any transistor, except the drain current dependence on G1 voltage is not quadratic, but is linear for second control gate (G2) voltage values 203 over a predetermined minimum threshold. As depicted, the drain current dependence on G1 voltage is only non-linear for small second control gate (G2) voltage values 201, 202 (e.g., $V_{G2}$=0 Unit Volts or $V_{G2}$=0.2 Unit Volts), but is linear for larger second control gate (G2) voltage values 203 (e.g., $V_{G2}$=0.4 Unit Volts or $V_{G2}$=0.7 Unit Volts or $V_{G2}$=1.0 Unit Volts).

In addition, a second control gate (G2) is positioned adjacent to the first control gate and over the semiconductor channel to control the channel switching of the MMT device without influencing the magnitude of drain current, once the channel is fully accumulated. For this reason, the second control gate (G2) is referred to as the channel control gate. As illustrated with the G2 transfer characteristic 210, the curves 211-220 flatten with equal (linear) spacing between them. And as illustrated with the drain voltage transfer characteristic 240, the output characteristics for the MMT device flatten with equal (linear) spacing between them. The buried metal power rail/source/drain structures are Schottky junctions engineered to control current flow into and out of the MMT device.

By now it should be appreciated that there has been provided a method for forming a semiconductor device having nanosheet transistors integrated with multimodal transistor devices. In the disclosed method, a wafer substrate is provided that has an upper semiconductor layer extending across a field effect transistor region and a multimodal transistor (MMT) region. In selected embodiments, the wafer substrate includes a buried oxide substrate layer covered by the upper semiconductor layer. In other embodiments, the wafer substrate includes a monocrystalline silicon substrate. The disclosed method also includes processing the wafer substrate to form buried metal source/drain structures in the MMT region that are laterally spaced apart from one another and positioned below an MMT semiconductor channel layer that is epitaxially grown from the upper semiconductor layer in the MMT region. In selected embodiments, the buried metal source/drain structures are formed by selectively etching MMT source/drain openings through the upper semiconductor layer and into an underlying buried oxide layer in the MMT region; sequentially depositing an insulating liner layer, a barrier liner layer, and one or more metal layers to fill the MMT source/drain openings; polishing and/or recess etching the insulating liner layer, the barrier liner layer, and the one or more metal layers to form metal source/drain structures in the source/drain openings that are recessed below an upper surface of the upper semiconductor layer; epitaxially growing the MMT semiconductor channel layer from the upper semiconductor layer to bury the metal source/drain structures; and planarizing the MMT semiconductor channel layer with the upper surface of the upper semiconductor layer. In addition, the disclosed method includes processing the wafer substrate to form a transistor semiconductor channel in the field effect transistor region of the wafer substrate. In selected embodiments, the transistor semiconductor channel is formed by providing a stack of alternating first and second semiconductor layers on at least the field effect transistor region of the wafer substrate; selectively etching the stack of alternating first and second semiconductor layers to form a transistor stack on at least the field effect transistor region of the wafer substrate; processing the transistor stack to form epitaxial semiconductor current terminal regions adjacent to the transistor stack; and processing the transistor stack to selectively remove at least a portion of the first semiconductor layers, thereby forming control electrode openings between the second semiconductor layers which form the transistor semiconductor channel that connects the epitaxial semiconductor current terminal regions. In such embodiments, the first semiconductor layer may be a silicon germanium nanosheet layer, and the second semiconductor layer may be a silicon nanosheet layer. In addition, the sequential deposition of the first dielectric layer and the first conductive layer may include depositing an atomic layer deposition (ALD) oxide layer over the field effect transistor region and the MMT region; and depositing an ALD metal layer over the ALD oxide layer in the field effect transistor region and the MMT region, thereby filling the control electrode openings with the ALD oxide layer and ALD metal layer. In addition, the selective etching of the first conductive layer and the first dielectric layer may form the control electrode from the ALD oxide layer and ALD metal layer in the control electrode openings which surround the transistor semiconductor channel in the transistor stack formed from the second semiconductor layers. In addition, the selective etching of the first conductive layer and the first dielectric layer may form the first MMT channel control electrode in the MMT region to be located over the MMT semiconductor channel layer and to be laterally positioned between the buried metal source/drain structures. In addition, the selective etching of the second conductive layer may form the second MMT channel control electrode in the MMT region to be located over the MMT semiconductor channel layer and to be laterally positioned in alignment with the buried metal source structure. The disclosed method also includes sequentially depositing a first dielectric layer and a first conductive layer over the field effect transistor region and the MMT region. In addition, the disclosed method includes selectively etching the first conductive layer and the first dielectric layer to form a control electrode for the transistor semiconductor channel and to form a first MMT channel control electrode in the MMT region. The disclosed method also includes depositing a second dielectric layer and a second conductive layer over at least the MMT region. In addition, the disclosed method includes selectively etching the second conductive layer to form a second MMT current control electrode that is positioned adjacent to the first MMT channel control electrode to control current flow in the MMT semiconductor channel layer. As disclosed, the first MMT channel control electrode, second MMT channel control electrode, MMT semiconductor channel layer, and buried metal source/drain structures form a multimodal transistor device.

In another form, there has been provided a method for forming a semiconductor device having nanosheet transistors integrated with multimodal transistor devices. In the disclosed method, a substrate is provided that has an upper semiconductor layer formed over a buried oxide layer. In addition, the disclosed method includes forming buried metal source/drain structures in the substrate below the upper semiconductor layer. In selected embodiments, the buried metal source/drain structures are formed by selectively etching multimodal transistor (MMT) source/drain openings through the upper semiconductor layer and into the buried oxide layer; sequentially depositing an insulating liner layer, a barrier liner layer, and one or more metal layers to fill the MMT source/drain openings; and polishing and/or recess etching the insulating liner layer, the barrier liner layer, and the one or more metal layers to form metal source/drain structures in the source/drain openings that are recessed below an upper surface of the upper semiconductor layer. The disclosed method also includes epitaxially growing a MMT semiconductor channel layer from the upper semiconductor layer to cover the buried metal source/drain structures. In addition, the disclosed method includes forming a first insulator layer over at least the MMT semiconductor channel layer using a first conformal insulator atomic layer deposition (ALD) process. The disclosed method also includes forming a first conductor layer over the first insulator layer using a first conformal conductor ALD process. In addition, the disclosed method includes selectively etching at least the first conductor layer to form a first MMT channel control electrode that is positioned over the MMT semiconductor channel layer to extend between the buried metal source/drain structures. In addition, the disclosed method includes forming a second insulator layer over at least the first MMT channel control electrode and exposed portions of the MMT semiconductor channel layer. The disclosed method also includes forming a second conductor layer over the second insulator layer. In addition, the disclosed method includes selectively etching at least the second conductor layer to form a second MMT current control electrode that is positioned over the MMT semiconductor channel layer and adjacent to the first MMT channel control electrode to control current flow in the MMT semiconductor channel layer, where the second MMT current control electrode is insulated from the first MMT channel control electrode by the second insulator layer. In selected embodiments, the first MMT channel control electrode, second MMT channel control electrode, MMT semiconductor channel layer, and buried metal source/drain structures form a multimodal transistor device. In selected embodiments, the substrate is processed to form a transistor semiconductor channel in a field effect transistor region of the substrate after epitaxially growing the MMT semiconductor channel layer and before forming the first insulator layer over at least the MMT semiconductor channel layer. In such embodiments, the substrate is processed to form the transistor semiconductor channel by providing a stack of alternating first and second semiconductor layers on at least a field effect transistor region of the substrate; selectively etching the stack of alternating first and second semiconductor layers to form a transistor stack on at least the field effect transistor region of the substrate; processing the transistor stack to form epitaxial semiconductor current terminal regions adjacent to the transistor stack; and processing the transistor stack to selectively remove at least a portion of the first semiconductor layers, thereby forming control electrode openings between the second semiconductor layers which form the transistor semiconductor channel that connects the epitaxial semiconductor current terminal regions. In such embodiments, the first conformal insulator ALD process and the first conformal conductor ALD process sequentially fill the control electrode openings with the first insulator layer and the first conductor layer. In addition, the disclosed method may include selectively etching the first insulator layer and the first conductor layer to form a gate control electrode for the transistor semiconductor channel in the field effect transistor region of the substrate. In selected embodiments, the method selectively etches at least the second conductor layer to form the second MMT current control electrode to be positioned over one of the buried metal source/drain structures.

In yet another form, there has been provided a method and semiconductor device which includes a nanosheet transistor device and a multimodal transistor device formed on a substrate. As disclosed, the nanosheet transistor device includes a nanosheet stack formed on top of the substrate between first and second epitaxial current terminal semiconductor regions, where the nanosheet stack includes an all-around control electrode formed around semiconductor layers from the nanosheet stack which connect the first and second epitaxial current terminal semiconductor regions. In addition, the disclosed multimodal transistor device is integrated with the nanosheet transistor device on top of the substrate to include recessed metal source/drain structures formed in the substrate to be laterally spaced apart from one another, an epitaxial semiconductor channel layer formed in the substrate to cover and extend over the recessed metal source/drain structures, a channel control electrode positioned over the epitaxial semiconductor channel layer to extend between the metal source/drain structures, and a current control electrode positioned over part of the epitaxial semiconductor channel layer and over one of the metal source/drain structures to control current flow in the epitaxial semiconductor channel layer, where the current control electrode is isolated from the channel control electrode by an insulator layer.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the depicted nanosheet transistor structures may be formed with different processing steps that can be combined and integrated with MMT device fabrication steps, and can utilize Si/SiGe superlattice structures having different numbers of SiGe and Si layers. In addition, the MMT processing steps may be integrated with processing steps for fabricating other types of thin film FET devices besides nanosheet transistors, including but not limited to processing steps for fabricating bulk planar FET devices, fully depleted SOI planar devices, bulk and SOI FinFET devices, bulk planar floating gate non-volatile devices, bulk planar thin film storage (TFS)

non-volatile devices, and the like. Also, the various silicon-based constituent layers may be formed with different conductive materials than those disclosed. In addition, the epitaxial sources and drains may be p-type or n-type, depending on whether forming either p-type or n-type semiconductor devices. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device comprising:
   providing a wafer substrate comprising a field effect transistor region and a multimodal transistor (MMT) region;
   processing the wafer substrate to form metal source/drain structures in the MMT region that are laterally spaced apart from one another and positioned below an MMT semiconductor channel layer;
   processing the wafer substrate to form a transistor semiconductor channel in the field effect transistor region of the wafer substrate;
   sequentially depositing a first dielectric layer and a first conductive layer over the field effect transistor region and the MMT region;
   selectively etching the first conductive layer and the first dielectric layer to form a control electrode for the transistor semiconductor channel and to form a first MMT channel control electrode in the MMT region;
   depositing a second dielectric layer and a second conductive layer over at least the MMT region; and
   selectively etching the second conductive layer to form a second MMT current control electrode that is positioned adjacent to the first MMT channel control electrode to control current flow in the MMT semiconductor channel layer.

2. The method of claim 1, where the first MMT channel control electrode, second MMT channel control electrode, MMT semiconductor channel layer, and metal source/drain structures form a multimodal transistor device.

3. The method of claim 1, where the wafer substrate comprises a buried oxide substrate layer covered by an upper semiconductor layer.

4. The method of claim 1, where the wafer substrate comprises a monocrystalline silicon substrate.

5. The method of claim 1, where processing the wafer substrate to form metal source/drain structures comprises:

selectively etching MMT source/drain openings through an upper semiconductor layer and into an underlying buried oxide layer in the MMT region;

sequentially depositing an insulating liner layer, a barrier liner layer, and one or more metal layers to fill the MMT source/drain openings;

polishing and/or recess etching the insulating liner layer, the barrier liner layer, and the one or more metal layers to form metal source/drain structures in the source/drain openings that are recessed below an upper surface of the upper semiconductor layer;

epitaxially growing the MMT semiconductor channel layer from the upper semiconductor layer to bury the metal source/drain structures; and planarizing the MMT semiconductor channel layer with the upper surface of the upper semiconductor layer.

6. The method of claim 1, where processing the wafer substrate to form the transistor semiconductor channel comprises:

providing a stack of alternating first and second semiconductor layers on at least the field effect transistor region of the wafer substrate;

selectively etching the stack of alternating first and second semiconductor layers to form a transistor stack on at least the field effect transistor region of the wafer substrate; and processing the transistor stack to selectively remove at least a portion of the first semiconductor layers, thereby forming control electrode openings between the second semiconductor layers which form the transistor semiconductor channel.

7. The method of claim 6, where the first semiconductor layer comprises a silicon germanium nanosheet layer, and where the second semiconductor layer comprises a silicon nanosheet layer.

8. The method of claim 6, where sequentially depositing the first dielectric layer and the first conductive layer comprises:

depositing an atomic layer deposition (ALD) oxide layer over the field effect transistor region and the MMT region; and depositing an ALD metal layer over the ALD oxide layer in the field effect transistor region and the MMT region, thereby filling the control electrode openings with the ALD oxide layer and ALD metal layer.

9. The method of claim 8, where selectively etching the first conductive layer and the first dielectric layer forms the control electrode from the ALD oxide layer and ALD metal layer in the control electrode openings which surround the transistor semiconductor channel in the transistor stack formed from the second semiconductor layers.

10. The method of claim 6, where selectively etching the first conductive layer and the first dielectric layer forms the first MMT channel control electrode in the MMT region to be located over the MMT semiconductor channel layer and to be laterally positioned between the metal source/drain structures.

11. The method of claim 6, where selectively etching the second conductive layer forms the second MMT channel control electrode in the MMT region to be located over the MMT semiconductor channel layer and to be laterally positioned in alignment with the metal source structure.

12. A method for forming a semiconductor device comprising:

providing a substrate comprising an upper semiconductor layer formed over a buried oxide layer;

forming metal source/drain structures in the substrate below the upper semiconductor layer;

epitaxially growing a multimodal transistor (MMT) semiconductor channel layer from the upper semiconductor layer to cover the metal source/drain structures;

forming a first insulator layer over at least the MMT semiconductor channel layer using a first conformal insulator atomic layer deposition (ALD) process;

forming a first conductor layer over the first insulator layer using a first conformal conductor ALD process;

selectively etching at least the first conductor layer to form a first MMT channel control electrode that is positioned over the MMT semiconductor channel layer to extend between the metal source/drain structures;

forming a second insulator layer over at least the first MMT channel control electrode and exposed portions of the MMT semiconductor channel layer;

forming a second conductor layer over the second insulator layer;

selectively etching at least the second conductor layer to form a second MMT current control electrode that is positioned over the MMT semiconductor channel layer and adjacent to the first MMT channel control electrode to control current flow in the MMT semiconductor channel layer, where the second MMT current control electrode is insulated from the first MMT channel control electrode by the second insulator layer.

13. The method of claim 12, where forming metal source/drain structures comprises:

selectively etching MMT source/drain openings through the upper semiconductor layer and into the buried oxide layer;

sequentially depositing an insulating liner layer, a barrier liner layer, and one or more metal layers to fill the MMT source/drain openings; and polishing and/or recess etching the insulating liner layer, the barrier liner layer, and the one or more metal layers to form metal source/drain structures in the source/drain openings that are recessed below an upper surface of the upper semiconductor layer.

14. The method of claim 12, further comprising processing the substrate to form a transistor semiconductor channel in a field effect transistor region of the substrate after epitaxially growing the MMT semiconductor channel layer and before forming the first insulator layer over at least the MMT semiconductor channel layer.

15. The method of claim 14, where processing the substrate to form the transistor semiconductor channel comprises:

providing a stack of alternating first and second semiconductor layers on at least a field effect transistor region of the substrate;

selectively etching the stack of alternating first and second semiconductor layers to form a transistor stack on at least the field effect transistor region of the substrate;

processing the transistor stack to form epitaxial semiconductor current terminal regions adjacent to the transistor stack; and processing the transistor stack to selectively remove at least a portion of the first semiconductor layers, thereby forming control electrode openings between the second semiconductor layers which form the transistor semiconductor channel that connects the epitaxial semiconductor current terminal regions.

16. The method of claim 15, where the first conformal insulator ALD process and the first conformal conductor ALD process sequentially fill the control electrode openings with the first insulator layer and the first conductor layer.

17. The method of claim 16, further comprising selectively etching the first insulator layer and the first conductor layer to form a gate control electrode for the transistor semiconductor channel in the field effect transistor region of the substrate.

18. The method of claim 12, where the first MMT channel control electrode, second MMT channel control electrode, MMT semiconductor channel layer, and metal source/drain structures form a multimodal transistor device.

19. The method of claim 12, where selectively etching at least the second conductor layer forms the second MMT current control electrode to be positioned over one of the metal source/drain structures.

20. A semiconductor device comprising:

a substrate;

a nanosheet transistor device comprising a nanosheet stack formed on top of the substrate between first and second epitaxial current terminal semiconductor regions, where the nanosheet stack comprises an all-around control electrode formed around semiconductor layers from the nanosheet stack which connect the first and second epitaxial current terminal semiconductor regions; and a multimodal transistor device integrated with the nanosheet transistor device on top of the substrate, the multimodal transistor device comprising:

recessed metal source/drain structures formed in the substrate to be laterally spaced apart from one another;

an epitaxial semiconductor channel layer formed in the substrate to cover and extend over the recessed metal source/drain structures;

a channel control electrode positioned over the epitaxial semiconductor channel layer to extend between the metal source/drain structures; and a current control electrode positioned over part of the epitaxial semiconductor channel layer and over one of the metal source/drain structures to control current flow in the epitaxial semiconductor channel layer, where the current control electrode is isolated from the channel control electrode by an insulator layer.

* * * * *